(12) United States Patent
Aramaki et al.

(10) Patent No.: US 9,378,858 B2
(45) Date of Patent: Jun. 28, 2016

(54) REPAIR APPARATUS

(71) Applicant: Hitachi High-Tech Science Corporation, Minato-ku, Tokyo (JP)

(72) Inventors: Fumio Aramaki, Tokyo (JP); Anto Yasaka, Tokyo (JP); Osamu Matsuda, Tokyo (JP); Yasuhiko Sugiyama, Tokyo (JP); Hiroshi Oba, Tokyo (JP); Tomokazu Kozakai, Tokyo (JP); Kazuo Aita, Tokyo (JP)

(73) Assignee: Hitachi High-Tech Science Corporation, Minato-ku, Tokyo (JP)

( * ) Notice: Subject to any disclaimer, the term of this patent is extended or adjusted under 35 U.S.C. 154(b) by 0 days.

(21) Appl. No.: 14/466,524

(22) Filed: Aug. 22, 2014

(65) Prior Publication Data

US 2015/0053866 A1 Feb. 26, 2015

(30) Foreign Application Priority Data

Aug. 23, 2013 (JP) .................................. 2013-173954
Jul. 16, 2014 (JP) .................................. 2014-146187

(51) Int. Cl.
*G21K 1/14* (2006.01)
*G21K 5/04* (2006.01)
(Continued)

(52) U.S. Cl.
CPC .. *G21K 5/04* (2013.01); *G21K 1/14* (2013.01); *H01J 37/08* (2013.01); *H01J 37/3053* (2013.01); *H01J 2237/0807* (2013.01); *H01J 2237/202* (2013.01); *H01J 2237/31744* (2013.01)

(58) Field of Classification Search
CPC ...................... H01J 2237/0807; H01J 2237/06; H01J 2237/31744; H01J 2237/31742

USPC ........ 250/423 R; 430/5; 257/E21.25; 216/12, 216/58, 63, 66; 977/949
See application file for complete search history.

(56) References Cited

U.S. PATENT DOCUMENTS 7,431,856 B2 10/2008 Rezeq et al.
7,537,708 B2 5/2009 Koops et al.
(Continued)

FOREIGN PATENT DOCUMENTS

JP 2003-156833 A 5/2003
JP 2003-328161 A 11/2003
(Continued)

OTHER PUBLICATIONS

William B. Thompson et al., Proceedings of the 28th Annual LSI Testing Symposium (LSITS 2008), (2008) pp. 249-254, "The Helium Ion Microscope for Semiconductor Device Imaging and Failure Analysis Applicatons".
(Continued)

*Primary Examiner* — Jack Berman
*Assistant Examiner* — Kevin Chung
(74) *Attorney, Agent, or Firm* — Banner & Witcoff, Ltd.

(57) ABSTRACT

There is provided a repair apparatus including a gas field ion source which includes an ion generation section including a sharpened tip, a cooling unit which cools the tip, an ion beam column which forms a focused ion beam by focusing ions of a gas generated in the gas field ion source, a sample stage which moves while a sample to be irradiated with the focused ion beam is placed thereon, a sample chamber which accommodates at least the sample stage therein, and a control unit which repairs a mask or a mold for nano-imprint lithography, which is the sample, with the focused ion beam formed by the ion beam column. The gas field ion source generates nitrogen ions as the ions, and the tip is constituted by an iridium single crystal capable of generating the ions.

5 Claims, 13 Drawing Sheets

(51) Int. Cl.
*H01J 37/305* (2006.01)
*H01J 37/08* (2006.01)

(56) References Cited

U.S. PATENT DOCUMENTS

| | | | |
|---|---|---|---|
| 7,737,414 | B2 | 6/2010 | Kuo et al. |
| 8,257,887 | B2 | 9/2012 | Takaoka |
| 8,460,842 | B2 | 6/2013 | Ogawa et al. |
| 2004/0033425 | A1 | 2/2004 | Koops et al. |
| 2008/0011718 | A1 | 1/2008 | Koops et al. |
| 2009/0110951 | A1 | 4/2009 | Kuo et al. |
| 2009/0230299 | A1* | 9/2009 | Shichi ............ H01J 27/10 250/282 |
| 2010/0178601 | A1 | 7/2010 | Takaoka |
| 2011/0189593 | A1* | 8/2011 | Ogawa ............ G03F 1/24 430/5 |
| 2011/0233401 | A1* | 9/2011 | Nishinaka et al. ............ 250/310 |
| 2012/0328974 | A1* | 12/2012 | Takaoka ............ G03F 1/74 430/5 |
| 2013/0099133 | A1 | 4/2013 | Yasaka et al. |

FOREIGN PATENT DOCUMENTS

| | | |
|---|---|---|
| JP | 2008-239376 A | 10/2008 |
| JP | 2009-517840 A | 4/2009 |
| JP | 2009-107105 A | 5/2009 |
| JP | 2011-181894 A | 9/2011 |
| JP | 2013-089534 A | 5/2013 |
| WO | 2007/067296 A2 | 6/2007 |
| WO | 2009/022603 A1 | 2/2009 |

OTHER PUBLICATIONS

B.W. Ward et al., Journal of Vacuum Science & Technology, vol. 24, (2006), pp. 2871-2874, "Helium ion microscope: A new tool for nanoscale microscopy and metrology".

Ivan Ermanoski et al., Surf, Sci. vol. 596, (2005), pp. 89-97, "Atomic structure of O/Ir (210) nanofacets".

Ivan Ermanoski et al., Surf, Sci. vol. 549, (2004), pp. 1-23, "Oxygen-induced nano-faceting of IR(210)".

Hong-Shi Kuo et al., Nanotechnology, vol. 20, (2009) No. 335701, "A Single-atom sharp iridium tip as an emitter of gas field ion sources".

* cited by examiner

REPAIR APPARATUS

CROSS-REFERENCE TO RELATED APPLICATION

This application claims priority from Japanese Patent Application No. 2013-173954, filed on Aug. 23, 2013 and Japanese Patent Application No. 2014-146187, filed on Jul. 16, 2014, the entire subject matter of which is incorporated herein by reference.

TECHNICAL FIELD

The present invention relates to a repair apparatus using an ion beam and including a gas field ion source, and more particularly, relates to a repair apparatus which repairs a defect or the like present in a photomask, an EUV mask, a nano-imprint original plate, or the like to be used when forming a micro pattern in producing a semiconductor device or the like.

BACKGROUND

Conventionally, a mask to be used in a pattern exposure apparatus when producing a semiconductor device or the like is a transmissive mask, a reflective mask for Extreme Ultra Violet (EUV) exposure, or the like. In a case where a defect or the like is present in a pattern of such a mask, there has been known a method in which not an entire surface of an expensive mask is produced again, but only a defect or the like is repaired from economical and temporal points of view. A repair apparatus to be used for this purpose can also be applied to a nano-imprint original plate (mold) other than the mask, and there has been known a mask repair apparatus using a focused ion beam (FIB) of gallium ions or an electron.

For example, there has been disclosed an apparatus using as an irradiation beam, a focused ion beam formed by focusing ions emitted from a liquid metal ion source in an ion optical system (for example, JP-A-2003-156833). This apparatus repairs a mask by removing an unnecessary pattern in a minute region and depositing a film onto a pattern missing portion or the like using a focused ion beam of gallium ions focused to a diameter of about several nanometers.

For example, there has been disclosed a mask repair apparatus using an electron beam and an assist gas (for example, JP-A-2003-328161). In this apparatus, as compared with the focused ion beam of gallium ions, a decrease in transmittance due to ion implantation is prevented, and the apparatus has excellent beam focusing performance.

Further, conventionally, there has been known a gas field ion source (GFIS) as an ion source of a focused ion beam apparatus which is expected to have better focusing performance than the focused ion beam of gallium ions. The gas field ion source can form a focused ion beam by ionizing a source gas in a high electric field region at the apex of a tip, and the degree of energy spread of emitted ions is as small as a fraction of that of the liquid metal ion source, and therefore, the beam focusing performance thereof is higher than the focused ion beam of gallium ions. In the same manner as an electron beam, an etching effect is exhibited by secondary electrons and an assist gas, however, a region where the secondary electrons are generated is smaller than in the case of an electron beam, and therefore, it is expected that processing in a minute region can be performed.

Incidentally, a sharpened needle-like electrode which generates ions in a gas field ion source is referred to as a "tip". This sharpened needle-like electrode is also used as a needle-like electrode of an electron source in an electron microscope, a probe in a scanning probe microscope, and the like. Conventionally, in order to obtain a high resolution image in an electron microscope and a focused ion beam apparatus, the apex of a tip has been desired to be sharpened in a level of several atoms. Further, in order to prolong the lifetime of a tip and also to obtain a high resolution image in a scanning probe microscope, it has been demanded that the apex of a tip should be sharpened to an atomic level, and the lifetime should be prolonged.

FIGS. 13A to 13C show schematic shapes of a conventional tip 500. As shown in FIG. 13A, the tip 500 is formed such that the tip end of a fine wire having a diameter of several hundreds of micrometers or less has a narrow and sharp shape by electrolytic polishing (also referred to as "wet etching"). As show in FIG. 13B, the tip 500 has a minute protrusion 501 in the apex portion B. As shown in FIG. 13C, the minute protrusion 501 has a triangular pyramid shape formed by stacking several atomic layers, and the apex of the protrusion 501 is constituted by at most several atoms. Hereinafter, the protrusion 501 is referred to as a "pyramid structure".

Next, the principle of ion generation of the gas field ion source using the tip 500 will be described with reference to FIG. 14.

As an ion source, a gas to be ionized is supplied, and in the surroundings of the tip 500, a gas molecule or atom (hereinafter described for short as "gas molecule") 601 to be ionized exists. The tip 500 is cooled by a cooling device (not shown).

When a voltage is applied between the tip 500 and an extraction electrode 603 by a power source 602, and a high electric field is generated around the apex of the tip 500, the gas molecule 601 drifting around the tip 500 is polarized and moves as if it is attracted to the apex of the tip 500 by the polarizing power. Then, the attracted gas molecule 601 is ionized by the high electric field at the apex of the tip 500.

The generated ion 604 is emitted from an opening 603a of the extraction electrode 603 to a sample (not shown) through an ion optical system (not shown) downstream of the opening. Since the size of a region from which a beam of the ions 604 (ion beam) is emitted, that is, the source size of the ion source is extremely small, this gas field ion source becomes a high brightness ion source and can form an extremely fine focused ion beam on the sample.

Conventionally, there has been known a technique using a tungsten tip in a focused ion beam apparatus (or an ion microscope) including a gas field ion source (JP-A-2009-517840).

For example, there has been disclosed a method for repairing a defect in a photomask using a gas field ion source (for example, WO 2009/022603). In a repair apparatus using a rare gas ion beam generated from this gas field ion source, a decrease in mask transmittance (for example, a decrease in mask transmittance due to implantation of gallium in the mask caused by a conventional focused ion beam of gallium ions) can be reduced. Further, argon which is a kind of rare gas has a larger mass than an electron, and therefore, the processing efficiency is increased as compared with the case of repairing a mask using an electron beam.

There has been known, for example, a mask repair apparatus which forms a focused ion beam by ionizing nitrogen (for example, JP-A-2013-89534). This mask repair apparatus uses, as the tip, a tip composed of tungsten or molybdenum, or a tip obtained by coating a needle-shaped base material composed of tungsten or molybdenum with a noble metal such as platinum, palladium, iridium, rhodium, or gold.

There has been disclosed, for example, repair of a mask for extreme ultraviolet light exposure using a hydrogen ion beam generated from a gas field ion source (for example, JP-A-

2011-181894). A tip for this mask repair is formed by coating a needle-shaped base material composed of tungsten or molybdenum with a noble metal such as platinum, palladium, iridium, rhodium, or gold. The apex of this tip is in a pyramid shape sharpened at the atomic level.

A method for sharpening the apex of a tip at the atomic level is important, but it is difficult to carry out the method, and various methods have been known.

In a tip, a crystal plane with a low planar atomic density on the crystal surface tends to be sharpened, and therefore, a tungsten tip is sharpened in the <111> direction. The {111} crystal plane of tungsten has a threefold rotational symmetry, and a {110} crystal plane or a {112} crystal plane composes a side surface (pyramid surface) of a pyramid structure.

As a method for sharpening the apex of the tungsten tip in a level of several atoms, there has been known a method such as field-induced gas etching using nitrogen or oxygen, thermal faceting, or remolding, and by those methods, the apex in the <111> direction can be sharpened with high reproducibility.

The field-induced gas etching is a method for etching a tungsten tip by introducing nitrogen gas while observing a Field Ion Microscope (FIM) image using helium or the like as an imaging gas by an FIM. The ionization field strength of nitrogen is lower than that of helium, and therefore, nitrogen gas cannot come closer to a region where the FIM image can be observed (that is, a region where helium is field-ionized) and is adsorbed on the side surface of the tip at a short distance away from the apex of the tungsten tip. Then, the nitrogen gas is bonded to a tungsten atom on the surface of the tip to form tungsten nitride. Tungsten nitride has low evaporation field strength, and therefore, only the side surface of the tip at a short distance away from the apex on which nitrogen gas is adsorbed is selectively etched. At this time, a tungsten atom at the apex of the tungsten tip is not etched, and therefore, a tip having a further sharpened apex than an electrolytically polished tip can be obtained (for example, U.S. Pat. No. 7,431, 856B).

The thermal faceting is a method for forming a polyhedral structure at the apex of a tip by heating the tip after electrolytic polishing in an oxygen atmosphere to grow a specific crystal plane (for example, JP-A-2009-107105).

The remolding is a method for forming a crystal plane at the apex of a tip by heating and applying a high voltage to the tip after electrolytic polishing under ultrahigh vacuum conditions (for example, JP-A-2008-239376).

Further, there has been known a scanning ion microscope (i.e. a focused ion beam apparatus) using a focused helium ion beam which includes a gas field ion source using a tungsten tip sharpened at the atomic level (for example, William B. Thompson et al., Proceedings of the 28th Annual LSI Testing Symposium (LSITS 2008), (2008) pp. 249-254, "Helium Ion Microscope for Semiconductor Device Imaging and Failure Analysis Applications"). In this focused ion beam apparatus, the apex of the tip is constituted by three tungsten atoms (a trimer), each of which emits ions, and ions emitted from one atom among these three atoms are selected and focused into a beam.

Further, it has been known that in a scanning ion microscope using a focused helium ion beam which includes a gas field ion source using a tungsten tip, the apex of the tungsten tip which emits ions is terminated with a trimer composed of three tungsten atoms, each of which emits ions, and ions emitted from one atom among these three atoms are selected and focused into a beam (for example, B. W. Ward et al., Journal of Vacuum Science & Technology, vol. 24, (2006), pp. 2871-2874, "Helium ion microscope: A new tool for nanoscale microscopy and metrology").

Further, it has been known that a minute triangular pyramid structure composed of one {110} crystal plane and two {311} crystal planes is formed at the apex of an iridium<210> single crystal tip (for example, Ivan Ermanoski et al., Surf. Sci. vol. 596, (2005), pp. 89-97, "Atomic structure of O/Ir(210) nanofacets").

Further, it has been known that a minute triangular pyramid composed of one {110} crystal plane and two {311} crystal planes is formed by thermal faceting at the apex of a sharpened iridium<210> single crystal tip, and the apex thereof is constituted by a single atom. A gas field ion source using this iridium tip can continuously emit a beam for about 2,250 seconds (see, for example, Hong-Shi Kuo et al., Nanotechnology, vol. 20, (2009) No. 335701, "A Single-atom sharp iridium tip as an emitter of gas field ion sources").

SUMMARY (With Respect to Focused Gallium Ion Beam)

There has been known a mask repair apparatus using a focused gallium ion beam or an electron beam. Processing using a focused gallium ion beam enables etching of various materials by a sputtering effect. However, when a gallium ion is implanted in a region of a mask where light is to be transmitted, a problem arises that the light transmittance is decreased. Further, a problem arises that the focusing performance of the focused gallium ion beam is not sufficient to obtain a minimum processing dimension required for repairing the most advanced mask with an ultra-fine dimension.

(With Respect to Electron Beam)

On the other hand, a mask repair apparatus using an electron beam and an assist gas can perform minimum processing required for repairing a photomask with an ultra-fine dimension without decreasing the light transmittance of a beam-irradiated region. However, since the mask repair apparatus has low sputtering efficiency for a mask material, the processing efficiency is low, and also a contrast when a pattern is observed using an electron beam is low, and therefore, a problem arises that the pattern cannot be observed clearly. Further, in recent years, with respect to a phase shift photomask using molybdenum silicide (MoSi) or the like in a light shielding film, there has been made several proposals of the light shielding film having enhanced resistance to damage due to light exposure or cleaning. However, the composition of such a light shielding film is close to the composition of a base glass substrate, and therefore, there is no assist gas which causes a difference in etching speed between the light shielding film and the base glass substrate. Therefore, a problem arises that etching material selectivity is low and it is difficult to stop etching at a desired position such as a boundary surface between the light shielding film and the base glass substrate. Further, the minimum processing dimension has a limit of 20 to 30 nm, and therefore, this apparatus cannot cope with a pattern with an extremely fine dimension such as a next-generation EUV mask.

(With Respect to Gas Field Ion Source)

A mask repair apparatus using a gas field ion source has a problem that a sample is damaged due to the sputtering effect of an argon ion beam when observing the sample. On the other hand, in the case of helium having a small mass, the damage to a light transmissive region can be reduced, and also the focusing performance is enhanced as compared with the focused gallium ion beam, however, the etching efficiency for a sample is low, and therefore, a problem arises that it takes an enormous time for repairing a mask. Further, a tip in the gas field ion source has problems as described below.

(With Respect to Tungsten Tip)

When a tip is formed from tungsten, a problem arises that the tip has low resistance to a chemically active gas species which is a gas to be ionized, for example, nitrogen gas or the like, and the lifetime of an ion source is short. For example, in the case where oxygen or nitrogen is adhered to the surface of a tungsten tip, a reaction occurs to form tungsten oxide or tungsten nitride having a low evaporation field strength, and a damage due to the field evaporation of such an oxide or a nitride from the surface of the tungsten tip at a low field strength may proceed. A small amount of oxygen or nitrogen is used in a sharpening process of the tungsten tip, and therefore, the formation of an oxide or a nitride on the surface of the tungsten tip cannot be avoided, and if the apex of the tungsten tip is damaged, the generated ion current may vary, and moreover, ion emission may be stopped. Further, if the apex of the tungsten tip is damaged, it is necessary to perform a sharpening process again, and a problem arises that the downtime of the apparatus including this tungsten tip is increased. In view of such problems, helium gas is introduced into an ion source chamber so as to emit helium ions from a gas field ion source including the tungsten tip. However, in this case, a pure gas, which is expensive, is needed, and a problem arises that the cost is increased.

Further, the tungsten tip has an apex constituted by three atoms called "trimer" at the apex and simultaneously emits three beams from these three atoms. An apparatus including this gas field ion source selects, from among the three beams emitted from the tungsten tip, one beam with an aperture disposed in an ion beam path, focuses the beam, and irradiates the beam on a sample. Therefore, a beam current reaching the sample is decreased to at least ⅓ of the total beam current. Further, even if the sum of the total ion emission current of three beams emitted from the apex of the tip is constant, the balance of the amount of the ion current emitted from each of the three atoms may be unstable. A decrease in beam current causes problems that the image quality is decreased in forming an image, and the processing amount is decreased in performing processing. Therefore, with the use of such a tungsten tip terminated with three atoms, a processing shape and an observation image may be unstable.

(With Respect to Coated Tip)

In the case of a tip obtained by coating a needle-shaped material composed of tungsten or molybdenum with a noble metal such as platinum, palladium, iridium, rhodium, or gold, a coating operation takes a time and during the coating operation, the apex may be damaged. Further, if the coating is insufficient, a problem arises that the tip is etched by a chemically active gas starting from a region where coating is insufficient.

(With Respect to Iridium Tip)

In view of the problem that the tungsten tip has an apex constituted by three atoms, it has been known that iridium is used in a tip as a material which enables the formation of an apex constituted by a single atom and also has higher chemical resistance than tungsten.

However, the inventors of the present application have found that in a finishing process for sharpening the apex of the iridium tip, it is difficult to form a structure having a desired shape (that is, a pyramid structure having an apex constituted by one atom) at a desired position by merely using a conventional technique.

(With Respect to Method for Sharpening Iridium Tip)

Further, the {210} crystal plane of iridium has a low planar atomic density and tends to be sharpened, and therefore, the iridium tip is sharpened in the <210> direction. As shown in FIG. 15, when viewing the {210} crystal plane of iridium from the front, the crystal has mirror image symmetry with respect to a plane containing the <110> axis and the <210> axis. Therefore, when field-induced gas etching is performed, a portion in the vicinity of the boundary surface between the {210} crystal plane and the {310} crystal plane is left. However, since the {310} plane has a rectangular shape, an odd number of atoms are not left. That is, in the case of iridium, it is difficult to perform formation at a desired position in a state where the number of terminal atoms is decreased such as a trimer and the like. Further, it has been found by an experiment made by the inventors of the present application that when the final sharpening finishing process is performed only by field evaporation, several atomic layers in the apex portion are field-evaporated at once in a block state in many cases, and it is difficult to form a desired apex at the apex.

(With Respect to Field-Induced Nitrogen Etching of Iridium Tip)

Further, as a method for sharpening the iridium tip, in the case of introducing oxygen gas in field-induced gas etching, which is a conventional method, a problem arises that since iridium has higher chemical resistance than tungsten, a time required for the processing is increased as compared with the case where tungsten is processed. Incidentally, in the case where nitrogen gas is introduced in place of introducing oxygen gas, a pyramid structure similar to that of tungsten can be formed at the apex of the tip. However, it is necessary to increase the pressure of nitrogen to be introduced. When the pressure of a gas to be introduced is increased, electric discharge between the tip and the extraction electrode is induced, and a risk of damage to the tip apex is increased. Further, the etching speed is decreased as compared with the case of tungsten, and therefore, a problem arises that a time required for the processing is increased.

Further, when the iridium tip is sharpened by field-induced gas etching, an apex is sometimes formed at a position other than the desired position, and it has been found by an experiment made by the inventors of the present application that it is difficult to form a pyramid structure at the same atomic position at each processing with high reproducibility. If the unstable reproducibility of the position of the tip apex is unstable, the position of emission of ions or electrons varies at each processing for forming the apex. Therefore, a problem arises that it is necessary to adjust the position of an ion source or an electron source each time so as to align the beam in an electron microscope or a focused ion beam apparatus with the optical axis with high accuracy, and thus, the conventional method is not preferred from the practical viewpoint.

(With Respect to Thermal Faceting of Iridium Tip)

Incidentally, by thermal faceting of the iridium tip in an oxygen atmosphere (forming a low-index crystal plane), the tip in the <210> direction can be sharpened with high reproducibility. However, when the final sharpening finishing process is performed only by thermal faceting, a desired apex is formed not only at a desired position, but also at a plurality of positions in some cases. Further, even if iridium is thermally processed, a desired crystal plane does not grow, and therefore, it is difficult to perform control so as to form a pyramid structure which is surrounded by given crystal planes and has an apex constituted by a single atom at a given position. Further, when thermal faceting is performed in a gas field ion source, oxygen atoms remaining in the gas field ion source act on the iridium tip as impurities, and stable ion emission may be inhibited. Accordingly, a method for sharpening the desired position without using oxygen has been demanded from the viewpoint of stable operation.

On the other hand, by using a mask repair apparatus including a gas field ion source, it is possible to change from an ion source gas having a large mass to an ion source gas having a small mass in the same apparatus. That is, if the mass of the irradiation ion species is large, processing and observation with characteristics similar to those in the case where a focused gallium ion beam is used can be performed, and if the mass of the irradiation ion species is small, processing and observation with characteristics similar to those in the case where an electron beam is used can be performed. The mass of the irradiation ion species can be selected according to the processing purpose or the like. For example, in the case where a MoSi-containing glass layer as a surface layer is removed in the repair of a defect in a phase shift photomask, it is necessary to stop etching at the boundary surface between the glass layer and the base glass substrate. In order to achieve this, a process in which the etching speed of the surface layer is faster than the etching speed of the base, that is, the material selectivity is high is required. However, when a beam of ions of a light element such as hydrogen or helium or an electron beam is used, since the surface layer and the base are composed of the same glass material, there is no great difference in etching speed. On the other hand, when a beam of ions of a little heavier element such as nitrogen or neon is used, since such a beam has a sputtering effect, a difference in the structure between the surface layer and the base makes a difference in etching speed. When a further heavier element such as argon, krypton, or xenon is used, a problem arises that the light transmittance is decreased due to implantation of ions. Therefore, ions of a little heavier element such as nitrogen or neon are most suitable for use in repairing a phase shift photomask.

The speed of processing with an ion beam is in proportion to an ion emission current, however, the ion emission current of a gas field ion source is lower by several digits than that of a focused gallium ion beam. That is, the processing speed is extremely slow, and therefore, an ion emission current which is as large as possible is required to be ensured. In the case where an ion emission current is increased by merely increasing a source gas pressure, electric discharge is induced at the tip apex, so that the tip apex may be damaged. Therefore, it is desired to use the source gas which is easily ionized at a low gas pressure. Here, the ionization efficiency of nitrogen is higher than that of neon, and therefore, at the same gas pressure, a high ion emission current is more easily obtained by a nitrogen beam than by a neon beam, and it has been found by the inventors of the present application that a focused nitrogen ion beam is most suitable for use in repairing a photomask.

However, nitrogen gas is corrosive to a certain type of metal, and tungsten which is normally used as a tip material of a conventional gas field ion source using helium gas is corroded (etched) even if only a small amount of nitrogen is mixed in helium gas. Therefore, the shape of the tip is deformed, and the apex portion of the tip serving as an ion emission section is damaged, so that the ion emission may be stopped. Therefore, in a conventional gas field ion source using a tungsten tip, it is difficult to realize the formation of a nitrogen ion beam by supplying nitrogen gas as a main component.

The present invention has been made in view of the above circumstances, and an object of the present invention is to provide a repair apparatus including a gas field ion source which causes less damage to a sample and is capable of repairing a minute region of a mask or the like stably and efficiently over a long period of time.

(1) According to an aspect of the present invention, there is provided a repair apparatus comprising: a gas field ion source which includes an ion generation section including a sharpened tip; a cooling unit which is configured to cool the tip; an ion beam column which is configured to form a focused ion beam by focusing ions of a gas generated in the gas field ion source; a sample stage which is configured to move while a sample to be irradiated with the focused ion beam formed by the ion beam column is placed thereon; a sample chamber which is configured to accommodate at least the sample stage therein; and a control unit which is configured to repair a mask or a mold for nano-imprint lithography, which is the sample, with the focused ion beam formed by the ion beam column, wherein the gas field ion source is configured to generate nitrogen ions as the ions, and the tip is constituted by an iridium single crystal capable of generating the ions.

(2) In the repair apparatus according to (1), the tip may include a pyramid structure having an apex constituted by a single iridium atom.

(3) In the repair apparatus according to (1) or (2), the tip may be constituted by an iridium single crystal with <210> orientation, and an apex portion of the tip has an apex surrounded by one {100} crystal plane and two {111} crystal planes.

(4) The repair apparatus according to any one of (1) to (3) may further comprise a gas supply section which is configured to supply a gas to be ionized to the ion generation section, and the gas supply section may include a container which is configured to store and supply each of a plurality of gas species.

(5) In the repair apparatus according to (4), the gas supply section may store at least nitrogen and hydrogen as the plurality of gas species.

(6) In the repair apparatus according to (5), the control unit may be configured to uses a hydrogen ion beam as the focused ion beam in a case where a mask for extreme ultraviolet light exposure is repaired as the mask, and to use a nitrogen ion beam as the focused ion beam in a case where a photomask is repaired as the mask.

(7) In the repair apparatus according to any one of (4) to (6) may further comprise a gas change section which is capable of changing the gas species to be supplied from the gas supply section.

(8) In the repair apparatus according to any one of (4) to (6) may further comprise an ion change section which is configured to change ion species by changing a voltage required for ionizing a gas in the ion generation section.

According to the above configuration, it is possible to provide a repair apparatus including a gas field ion source which causes less damage to a sample and is capable of repairing a minute region of a mask or the like stably and efficiently over a long period of time.

BRIEF DESCRIPTION OF THE DRAWINGS

The above and other aspects of the present invention will become more apparent and more readily appreciated from the following description of illustrative embodiments of the present invention taken in conjunction with the attached drawings, in which:

FIGS. 6A and 6B are views for explaining a pyramid structure at an apex portion of a tip of iridium according to an illustrative embodiment of the invention, wherein FIG. 6A is a view of an atomic model of the pyramid structure, and FIG. 6B is an explanatory view for showing crystal planes;

FIGS. 7A and 7B are views showing the arrangement of atoms in a crystal plane in the pyramid structure at the apex portion of the tip of iridium according to an illustrative embodiment of the invention, wherein FIG. 7A is a front view of a {100} crystal plane constituting a pyramid surface, and FIG. 7B is a front view of a {111} crystal plane constituting a pyramid surface;

FIGS. 8A and 8B are views for explaining a first pyramid structure at an apex portion of an iridium tip of a conventional example, wherein FIG. 8A is a view of an atomic model of the pyramid structure, and FIG. 8B is an explanatory view for showing crystal planes;

FIGS. 9A and 9B are views for explaining a second pyramid structure at an apex portion of an iridium tip of a conventional example, wherein FIG. 9A is a view of an atomic model of the pyramid structure, and FIG. 9B is an explanatory view for showing crystal planes;

FIGS. 10A and 10B are views showing the arrangement of atoms in a crystal plane in the pyramid structure at the apex portion of the iridium tip of the conventional example, wherein FIG. 10A is a front view of a {110} crystal plane constituting a pyramid surface, and FIG. 10B is a front view of a {311} crystal plane constituting a pyramid surface;

FIGS. 13A to 13C are schematic views for explaining a conventional tip, wherein FIG. 13B is an enlarged view of an apex portion A in FIG. 13A, and FIG. 13C is an enlarged view of an apex portion B in FIG. 13B;

DETAILED DESCRIPTION

Hereinafter, a repair apparatus according to illustrative embodiments of the present invention will be described with reference to the accompanying drawings.

(First Illustrative Embodiment) Repair Apparatus for Photomask

Figure 1:
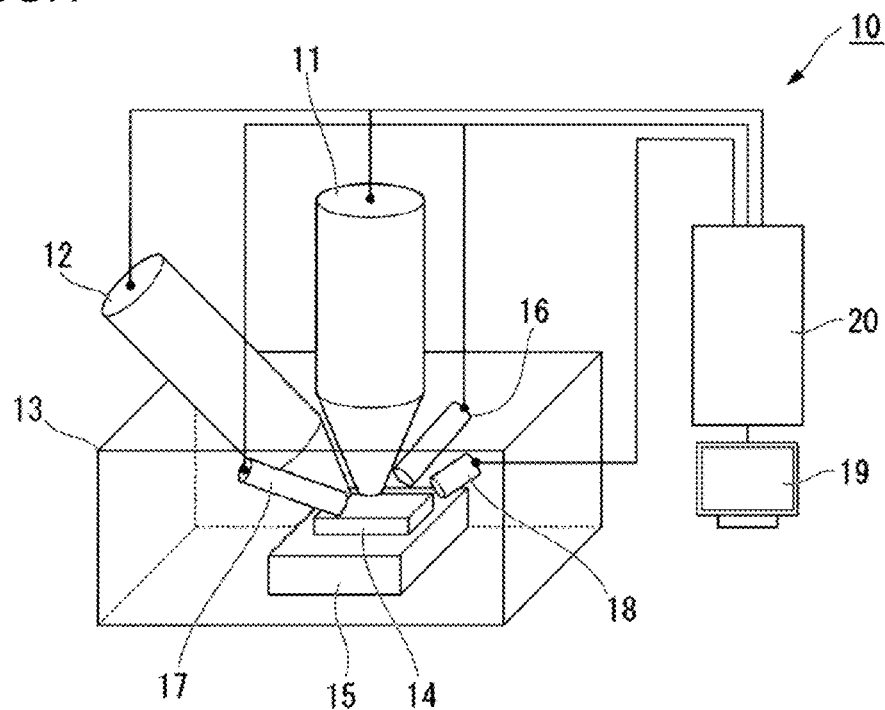
FIG. 1 is an explanatory view showing a schematic structure of a repair apparatus according to an illustrative embodiment of the invention.

First, with reference to FIG. 1, a repair apparatus 10 will be described.

The repair apparatus 10 repairs a defect present in a photomask to be used in a pattern exposure apparatus (not shown) when producing a semiconductor device or the like.

The repair apparatus 10 includes a gas field ion source (described later), and uses as ions to be emitted from the gas field ion source, not a light element such as helium, but nitrogen having high sputtering efficiency. Further, since the repair apparatus 10 uses an ionized gas containing nitrogen as a main component, iridium having high chemical resistance is used as a tip as described later. A sharpened apex of this tip has a minute triangular pyramid shape which is composed of specific crystal planes and has an apex constituted by a single iridium atom.

The repair apparatus 10 mainly includes an ion beam column 11 including a gas field ion source (not shown), an electron beam column 12 including an electron source (not shown), a sample chamber 13, and a control unit 20.

The ion beam column 11 includes at least a gas field ion source (not shown), which is an ion generation source, and an ion beam optical system which forms a focused ion beam by focusing ions generated in the gas field ion source and scans and sweeps a mask 14, which is a sample. Incidentally, the details of the gas field ion source and the ion beam column 11 will be described later.

The electron beam column 12 includes at least an electron source (not shown), which is an electron generation source, and an electron beam optical system (not shown) which forms an electron beam by focusing electrons generated in the electron source and scans the mask 14, which is a sample.

Incidentally, the ion beam column 11 and the electron beam column 12 are disposed such that the focused ion beam and the electron beam are irradiated on substantially the same position on the mask 14. Incidentally, by using a tip assembly to be used as the gas field ion source (described later), as the electron source, an electron beam having favorable focusing performance can be obtained, and a clear Scanning Electron Microscope (SEM) image can be obtained. Further, the electron beam column 12 can irradiate an electron beam for neutralizing the electric charge generated by irradiation with an ion beam formed by the ion beam column 11.

The sample chamber 13 includes a sample stage 15 which can move in a state where the mask 14, which is a sample, is placed thereon. The sample stage 15 moves based on a command of an operator. For example, in the case where the sample stage 15 is configured to be able to be displaced in five axes, the sample stage 15 is supported by a displacement mechanism (not shown) which includes an XYZ axis mechanism (not shown) for moving the sample stage 15 along an X axis, a Y axis, and a Z axis, the X axis and the Y axis being orthogonal to each other within the same plane and the Z axis being orthogonal to both of the X axis and the Y axis, a tilt axis mechanism (not shown) for rotating and tilting the sample stage 15 about the X axis or the Y axis, and a rotating mechanism (not shown) for rotating the sample stage 15 about the Z axis.

Further, the sample chamber 13 includes a deposition gas supply section 16 which can supply a gas for deposition to a missing defect on the mask 14 and an etching gas supply section 17 which promotes selective removal of an excess defect on the mask 14. Accordingly, the control unit 20 can form a film of carbon, silicon oxide, tungsten, or the like on the mask 14 by irradiating an ion beam of nitrogen or the like while spraying a carbon-based gas, a silane-based gas, a carbon-based compound gas containing a metal such as tungsten, or the like on the mask 14 from the deposition gas supply section 16. The mask 14 on which the defect has been repaired in this manner can normally transfer the pattern without transferring the defect even if it is exposed to light.

Further, in the case where an excess defect pattern formed from a light shielding pattern section on the mask 14 is repaired, the control unit 20 irradiates an ion beam of nitrogen or the like while irradiating the defective region of the mask 14 with a halogen-based etching gas such as an iodine-based etching gas from the etching gas supply section 17. Accordingly, the control unit 20 can perform high speed processing of the mask pattern or can selectively remove only a desired material as compared with the case where an etching gas is not introduced.

Further, the sample chamber 13 includes a detector 18 which detects a secondary signal such as a secondary electron, a secondary ion, a reflected electron, or an X-ray generated from the mask 14 by irradiation with an ion beam or an electron beam, and a monitor 19 capable of displaying a result detected by the detector 18 as an observation image. Incidentally, the monitor 19 can also display various control values.

The control unit 20 includes an image forming section (an image forming section 131 shown in FIG. 4), an extraction voltage control section (an extraction voltage control section 132 shown in FIG. 4), an ion source gas control section (an ion source gas control section 133 shown in FIG. 4), a temperature control section (a temperature control section 134 shown in FIG. 4), and the like as described later. The control unit 20 controls a voltage to be applied to a condenser lens electrode (not shown), an objective lens electrode (not shown), and the like in an ion beam optical system or an electron beam optical system, and also controls the movement of the sample stage 15, and the like.

The extraction voltage control section in the ion beam optical system controls a voltage to be applied to an extraction electrode (not shown) of a gas field ion source (not shown), and adjusts an ion emission current and also operates when the pyramid structure at the apex of the tip is produced or processed.

In the image forming section, a sample is irradiated with a focused ion beam (described later), the generated secondary ions or/and secondary electrons are detected by the detector 18, whereby an observation image of the sample is displayed on the monitor 19, and thus, an observation can be performed. That is, in the image forming section, by irradiating the mask 14 with an ion beam of nitrogen or the like and detecting the secondary electrons, the state of the surface of the mask 14 can be examined. Further, by detecting the secondary ions, the distribution of elements constituting the surface of the mask 14 can be examined. The image of the surface of the mask 14, the elemental distribution result, and various control values can be displayed on the monitor 19.

Incidentally, the control unit 20 can maintain the inside of the ion beam column 11, the inside of the electron beam column 12, and the inside of the sample chamber 13 under vacuum by control of a vacuum pumping system provided in each section.

The ion source gas control section controls a gas flow rate control section (not shown), which controls the flow rate of a gas to be supplied to a gas field ion source, such as a mass flow controller, and an ion source gas supply section (not shown) including a gas species change section (not shown).

(Gas Field Ion Source)

Figure 2:
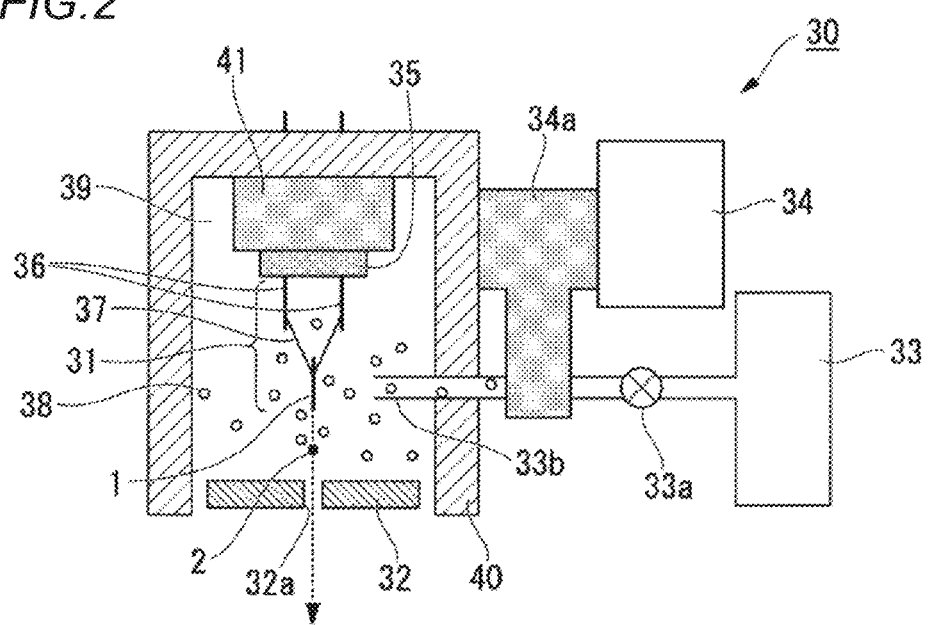
FIG. 2 is a schematic structural view for explaining the structure of a gas field ion source according to an illustrative embodiment of the invention.

FIG. 2 shows the basic structure of a gas field ion source (GFIS). The gas field ion source 30 mainly includes a tip assembly 31, an extraction electrode 32, an ion source gas supply section 33, and a cooling device 34.

Figure 3:
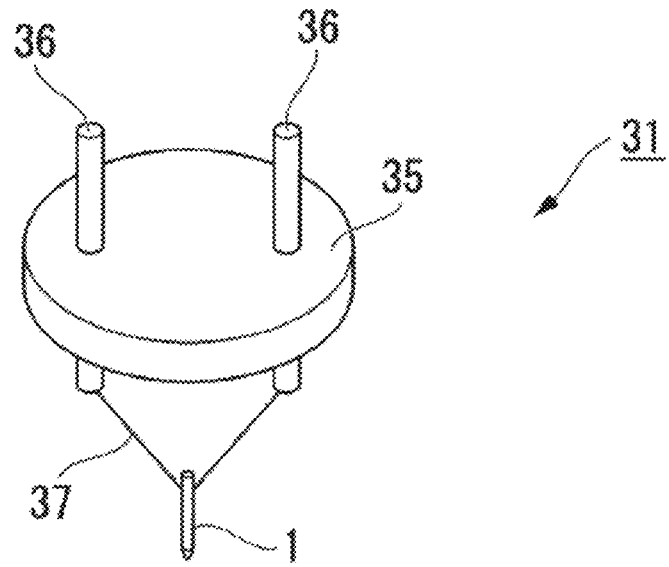
FIG. 3 is a perspective view of a tip assembly according to an illustrative embodiment of the invention.

As shown in FIG. 3, the tip assembly 31 mainly includes an insulating base member 35, a pair of conducting pins 36 fixed to the base member 35, a filament 37 composed of a fine wire of tungsten or the like connected between the end portions of the pair of conducting pins 36, and a tip 1 electrically and mechanically fixed to the filament 37.

The tip 1 is electrically and mechanically connected to the filament 37 by spot welding or the like, and emits ions from an apex portion thereof. The tip 1 is composed of iridium which can withstand a chemical reaction by nitrogen gas, and is specifically formed from an iridium single crystal with <210> orientation. The tip 1 has an apex sharpened at the atomic level so that an electric field is easily concentrated thereon. Further, the tip 1 has a novel minute pyramid structure at the apex for realizing the long-term operation of the gas field ion source 30. The pyramid structure is surrounded by one {100} crystal plane and two {111} crystal planes and has an apex with <210> orientation and constituted by only a single atom.

Further, the filament 37 can adjust the temperature of the tip 1, and is used when cleaning the surface of the tip 1 or producing the pyramid structure at the apex of the tip 1, or the like.

The detailed structure of the apex of this tip, its effect, and the production method thereof will be described in detail in the third illustrative embodiment.

The extraction electrode 32 is disposed apart from the apex of the tip 1 and includes an opening 32a. The extraction electrode 32 guides an ion 2 emitted by the tip 1 to the ion optical system downstream of the opening 32a through the opening 32a of the extraction electrode 32. An extraction power source (not shown) applies an extraction voltage between the extraction electrode 32 and the tip 1, whereby the gas molecule is ionized at the apex of the tip 1 to generate an ion 2, and extracts the ion 2 to the side of the extraction electrode 32.

The ion source gas supply section 33 supplies a gas (an ion source gas, for example, a gas molecule or the like) 38 to be ionized to the surroundings of the tip 1. The ion source gas supply section 33 communicates with an ion source chamber 39 through a gas introduction pipe 33b such that the flow rate can be adjusted by a valve 33a. The gas species to be provided in the ion source gas supply section 33 is not limited to one species, and gas cylinders (not shown, also referred to as gas containers) of a plurality of gas species are disposed, and the gases may be supplied to the ion source chamber 39 by changing the gas species as needed or by mixing a plurality of gas species. Further, in the case where a plurality of gas species are supplied, the optimum extraction voltage for each gas species are stored in the extraction voltage control section 132 in advance, and at the time of ion change, a command is given to the extraction voltage control section 132 from the ion change section (not shown) to perform change to desired gas ions among the plurality of gas species to be supplied and generate the desired gas ions.

In this illustrative embodiment, in the ion source gas supply section 33, nitrogen gas is used as the ion source gas to be supplied, however, the ion source gas is not limited thereto, and may be a rare gas such as helium, neon, argon, krypton, or xenon, or may be a molecular gas such as hydrogen or oxygen, or may be a mixed gas of any of these gases. For example, the ion source gas supply section 33 includes gas cylinders (not shown) containing each of helium, hydrogen, nitrogen, oxygen, and neon, and a desired gas is selected and may be supplied from the gas cylinder. For example, when a wide region of the apex portion of the tip at the atomic level is observed with a field ion microscope (FIM), helium may be supplied, when the apex of the tip 1 is sharpened, oxygen or nitrogen may be supplied, and when a focused ion beam is formed, any of hydrogen, nitrogen, and neon may be supplied. Further, when a mask (EUV mask) for Extreme Ultra Violet (EUV) exposure is repaired, since an EUV mask pattern is extremely vulnerable to damage caused by ion irradiation, the ion source gas supply section 33 supplies light ions, for example, hydrogen gas or the like. At this time, even if EUV masks are continuously repaired, desired repair can be performed by only change of gas species. For example, different types of masks can be repaired with one apparatus as follows: a defect in a photomask is repaired by using nitrogen gas as the ion source gas, and thereafter, a defect in an EUV mask is repaired by using hydrogen gas as the ion source gas.

Incidentally, the above document JP-A-2011-181894 discloses that an emitter tip of a gas field ion source which generates a hydrogen ion beam is a member composed of tungsten or molybdenum, or a member obtained by coating a needle-shaped base material composed of tungsten or molybdenum with a noble metal such as platinum, palladium, iridium, rhodium, or gold, and the apex thereof is in the form of a pyramid sharpened at the atomic level. However, JP-A-2011-181894 discloses that when a voltage applied to the emitter tip is too large, the constituent elements (tungsten and platinum) of the emitter tip are scattered on the side of the extraction electrode along with hydrogen ions. Therefore, JP-A-2011-181894 describes that a voltage applied to the emitter tip during operation (that is, during ion beam irradiation) is maintained at a voltage to such an value that the constituent elements of the emitter tip itself are not scattered. Accordingly, it is difficult to generate hydrogen ions while trying not to field-evaporate the constituent elements of the emitter tip in some cases.

On the other hand, the repair apparatus 10 of this illustrative embodiment is configured such that the tip 1 of the gas field ion source 30 which generates a hydrogen ion beam is composed of iridium and can repair an EUV mask, the apex of the tip 1 of iridium has a minute triangular pyramid structure having at least a {100} crystal plane, and the apex of the triangular pyramid structure is constituted by only a single iridium atom. According to this configuration, since the apex portion of the tip 1 is a densely constituted pyramid structure as compared with a conventional iridium tip, a hydrogen ion beam can be stably generated over a long period of time, and an effect that a desired region of an EUV mask can be repaired is exhibited.

In this manner, it is most suitable to change the ion species to be irradiated according to the physical properties of a target substance to be repaired, and in order to do this, the ions source gas supply section 33 may be configured to be able to dispose a plurality of gas cylinders (not shown), and may have a gas change section (not shown). This gas change section is controlled by the ion source gas control section 133.

The cooling device 34 cools the tip 1 and a supply gas 38 to be supplied into the ion source chamber 39 from the ion source gas supply section 33 with a cooling medium such as liquid helium or liquid nitrogen. The cooling medium at a low temperature generated by the cooling device 34 comes in contact with the wall surface 40 surrounding the tip assembly 31 and the gas introduction pipe 33b through a connection section 34a and cools these members and the inside of the ion source chamber 39.

Incidentally, the cooling device 34 is not limited to this configuration, and may have any configuration as long as it can cool at least the tip 1, and may have a configuration including, for example, a cooling block, a freezing machine, or the like. Further, between the ion source chamber 39 and the tip assembly 31, a cold head 41 for radiating the heat of the tip 1 is disposed. The cold head 41 is formed into a block shape with alumina, sapphire, or a ceramic material such as aluminum nitride, and fixed to the base member 35.

The cooling temperature of the tip 1 is controlled by a temperature control section of the control unit 20 and varies depending on the gas species to be supplied from the ion source gas supply section 33, however, in this illustrative embodiment, the temperature can be set within the range of about 40 K to 200 K. According to this configuration, the ion beam with a current required for fine processing can be stably irradiated.

Incidentally, in this illustrative embodiment, the configuration of the repair apparatus 10 is described using a photomask as an example of the mask 14, however, the repair apparatus 10 is not limited thereto and can also be applied to repair of a defect in an EUV mask.

(Ion Beam Column)

Figure 4:
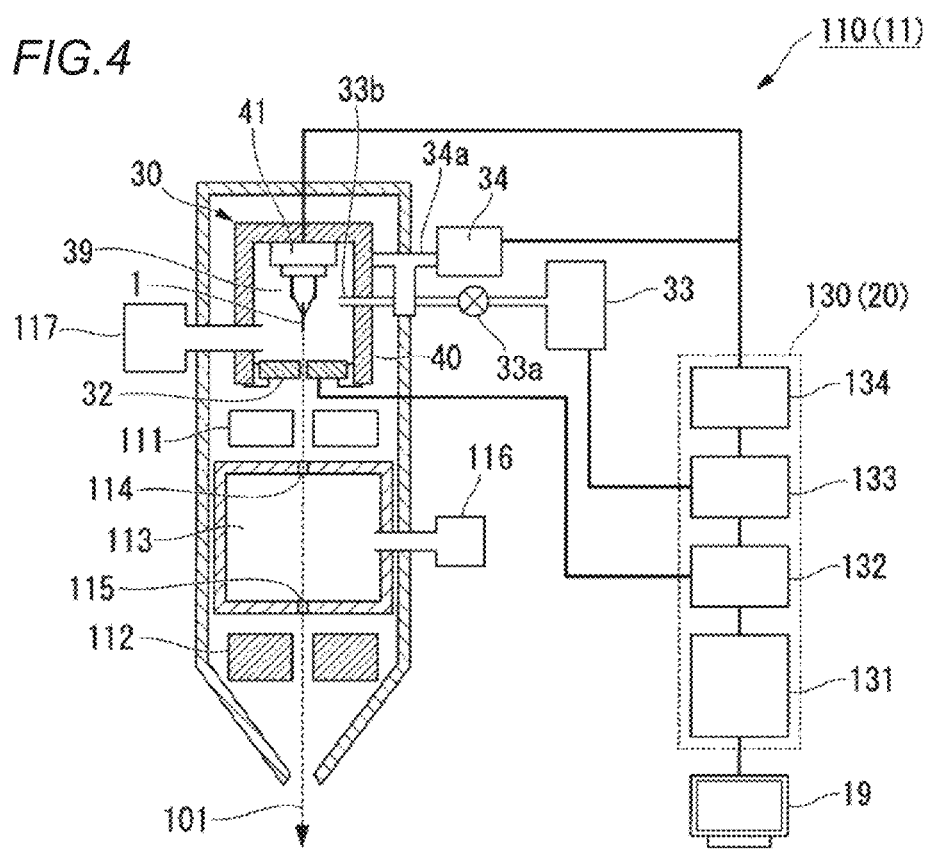
FIG. 4 is a structural view of an ion beam column according to an illustrative embodiment of the invention.

The configuration of an ion beam column will be described with reference to FIG. 4.

An ion beam column 110(11) includes at least the above-described ion source chamber 39 including the tip assembly 31, a condenser lens electrode 111 which condenses ions 2 emitted from the ion source chamber 39 to form a focused ion beam 101, and an objective lens electrode 112 which focuses the focused ion beam 101 on a sample (not shown).

A vacuum pump 117 maintains the degree of vacuum in the ion source chamber 39. For example, in the gas field ion source 30, the degree of vacuum before supplying an ion source gas is maintained at high vacuum, for example, at about $1 \times 10^{-5}$ to $1 \times 10^{-8}$ Pa. Between the ion source chamber 39 and a sample chamber (not shown) in which a sample is placed, an intermediate chamber 113 is provided, and between the ion source chamber 39 and the intermediate chamber 113 and between the sample chamber and the intermediate chamber 113, orifices 114 and 115 are provided, respectively.

In the ion beam column 110, the focused ion beam 101 is passed through the orifices 114 and 115 and is irradiated on the sample. The intermediate chamber 113 is connected to a vacuum pump 116 so that the degree of vacuum can be adjusted by the vacuum pump 116, and the intermediate chamber 113 enables differential pumping between the sample chamber and the ion source chamber 39. According to this ion beam optical system, a focused nitrogen ion beam having a diameter of 1 nm or less can be formed.

A control unit 130(20) includes an image forming section 131, an extraction voltage control section 132, an ion source gas control section 133, a temperature control section 134, and the like. The control unit 130 controls a voltage to be applied to the condenser lens electrode 111, the objective lens electrode 112, and the like in the ion beam optical system or the electron beam optical system, and also controls the movement of the sample stage (not shown) on which the sample is placed, and the like. The extraction voltage control section 132 in the ion beam optical system controls a voltage to be applied to the extraction electrode 32, and adjusts an ion emission current and also operates when the pyramid structure at the apex of the tip 1 is produced or processed.

The focused ion beam 101 of this gas ions may also be used in the observation of the surface of a sample utilizing secondary electrons generated from an irradiated portion (not shown) on the surface of the sample and processing (hole formation, removal of a surface layer, etc.) of the surface of the sample by utilizing sputtering of the sample with the gas ions irradiated on the sample.

Further, the ion beam column 110 includes a detector (a detector 18 shown in FIG. 1, etc.) for obtaining a Field Ion Microscope (FIM) image for confirming the atomic arrangement at the apex of the tip 1 of the gas field ion source 30. This detector is configured to be movable with respect to the ion beam axis, and in the case where the confirmation of an FIM image is not needed, the detector can be moved away from the ion beam axis and made to stand by. This detector enables the confirmation of the atomic arrangement at the apex of the tip 1 as needed, for example, in the case where an ion current becomes unstable, an observation image is disturbed, and so on. The tip 1 of iridium of this illustrative embodiment is composed of an iridium single crystal with <210> orientation and has a pyramid structure which has at least a {100} crystal plane at the apex portion of this tip 1, and the pyramid structure has an apex constituted by a single atom. This apex shape will be described in detail in the third illustrative embodiment.

Accordingly, the repair apparatus 10 of this illustrative embodiment capable of forming a nitrogen ion beam by the gas field ion source 30 having the tip 1 of iridium is a novel apparatus. And, according to this repair apparatus 10 of this illustrative embodiment, ion implantation, which decreases the light transmittance of a light transmissive region of the mask 14, does not occur. Further, an effect is obtained that finer processing can be achieved in comparison with the conventional repair of the mask 14 using a focused gallium ion beam.

It has been confirmed by an experiment made by the inventors of the present application that the stability of the focused nitrogen ion beam is as high as 1%/hour or less, and even if it is continuously operated for about 30 days, the atom at the apex of the tip 1 is not detached, and therefore, the focused nitrogen ion beam can be continuously formed without causing an interruption of ion emission or a variation in ion generation position.

This is a far longer lifetime than the continuous operation for about 2,250 seconds (at most 38 minutes) described in the above document, William B. Thompson et al., Proceedings of the 28th Annual LSI Testing Symposium (LSITS 2008), (2008) pp. 249-254, "Helium Ion Microscope for Semiconductor Device Imaging and Failure Analysis Applications". In the actual repair of a mask or the like, excess and insufficiency of processing strongly affect the light exposure performance of a mask, and therefore, a beam current during repair is required to be constant, and it is difficult to repair a mask when using the gas field ion source capable of performing continuous irradiation for at most about 38 minutes. On the other hand, according to the repair apparatus 10 of this illustrative embodiment capable of performing continuous irradiation for 30 days, many accurate repair operations can be performed.

Further, the repair apparatus 10 of this illustrative embodiment can visualize a surface state and an elemental distribution with high resolution and can provide a focused ion beam having a long lifetime and high stability.

In a commercially available focused ion beam apparatus using a conventional gas field ion source, since helium ions are used, the mass of the ions is very light, and therefore, a sputtering effect cannot be expected. Therefore, in the case where a light shielding film and a base glass substrate have a similar composition and there is no assist gas which causes a difference in etching speed between the light shielding film and the base glass substrate, the etching material selectivity is low, and it is difficult to stop etching at a desired position such as the boundary surface between the light shielding film and the base glass substrate. However, by the focused nitrogen ion beam generated by the repair apparatus 10 of this illustrative embodiment, it becomes possible to perform processing of a sample, and further, owing to its focusing performance, further finer local processing can be achieved even in comparison with the conventional commercially available focused gallium ion beam processing apparatus.

Further, in this illustrative embodiment, the repair apparatus 10 including the ion beam column 11 and the electron beam column 12 is described, however, even if the apparatus is configured such that the electron beam column 12 is omitted and only the ion beam column 11 is included, the apparatus has the same effect with respect to mask repair. An example of such a case will be described below.

The repair apparatus 10 having only the ion beam column 11 includes a hydrogen gas cylinder (not shown) and a nitrogen gas cylinder (not shown) in the ion source gas supply section 33, and enables adjustment in the ion source gas supply section 33 so that a mixed gas of hydrogen gas and nitrogen gas is supplied through the gas introduction pipe 33b. Since hydrogen is field-ionized at a field strength of about 22 V/nm and nitrogen is field-ionized at a field strength of about 17 V/nm, even if the repair apparatus 10 supplies a mixed gas of hydrogen gas and nitrogen gas into the ion source chamber 39, hydrogen ions and nitrogen ions can be separately emitted by adjusting the extraction voltage by the above-described ion change section. According to this configuration, the mask 14 is processed by a focused nitrogen ion beam, and the processed region of the mask can be observed using a focused hydrogen ion beam. Hydrogen is lighter than nitrogen and weighs equal to or less than a tenth of the weight of nitrogen, and therefore, the sputtering damage to the mask surface by irradiation with a focused ion beam is less in the case of a focused hydrogen ion beam, and thus, the focused hydrogen ion beam is suitable for observation of the mask surface. That is, when the field strength (extraction voltage) at the apex of the tip 1 is adjusted so as to ionize hydrogen, nitrogen gas is also ionized, however, hydrogen ions are generated in a narrow region just proximal to the atom at the apex of the tip 1, however, nitrogen ions are generated in a wide region at a short distance away from the atom at the apex of the tip 1. Therefore, when hydrogen ions are focused into a beam, nitrogen ions are formed into a low current density beam. Accordingly, when the mask surface is observed using a focused hydrogen ion beam, nitrogen ions are less likely to damage the mask surface. On the other hand, hydrogen is not ionized at a field strength (extraction voltage) at which nitrogen is ionized, and therefore, hydrogen ions do not reach the mask surface, and thus, hydrogen ions do not affect the mask surface when the mask is processed with a focused nitrogen ion beam.

In such a repair apparatus 10 having only the ion beam column 11, the gas is not limited to the above combination of nitrogen and hydrogen, and a combination of nitrogen with at least any one element selected from neon, argon, krypton, and xenon may be adopted. Further, the supply mode is not limited to the continuous supply of a mixed gas on a constant basis, and the gas species to be supplied according to the frequency of the processing or observation operation may be limited to one species.

(Second Illustrative Embodiment) Mask Repair Method

Figure 5:
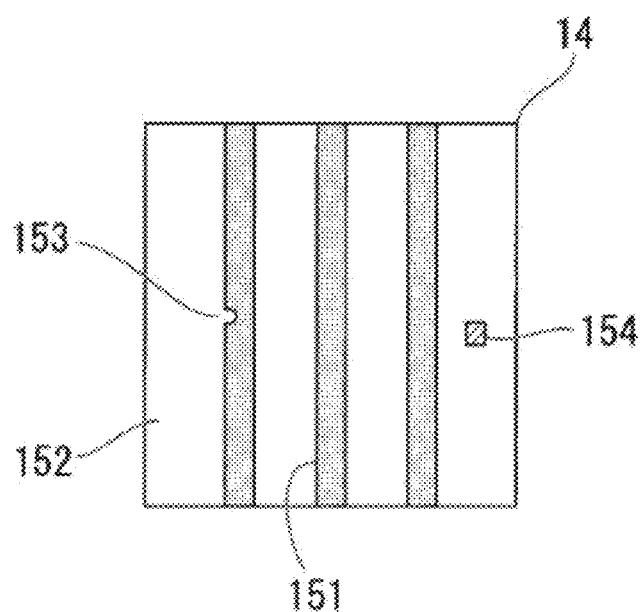
FIG. 5 is a view for explaining a pattern to be repaired by the repair apparatus according to an illustrative embodiment of the invention.

Next, a mask repair method using this repair apparatus 10 will be described with reference to FIG. 5. FIG. 5 is a schematic view of a secondary electron observation image by an ion beam of the mask 14.

The mask 14 has a light shielding pattern section 151 and a light transmissive section 152. There are a defect of a pattern missing portion 153 in a part of the light shielding pattern section 151, and a defect of an unnecessary pattern (excess defect) 154. Such a defect can be detected by comparing the original design information of the mask with the secondary electron observation image of the surface of the mask after completion of formation, or by comparing the secondary electron observation image of a region suspected to have a defect with the secondary electron observation image of a normal region. The coordinate information of the location of the defect, the type of the defect, the image information of the defect, and the like can be stored in the control unit 20 of the repair apparatus 10 or are used for obtaining information from an external information apparatus.

Further, the repair apparatus 10 performs calculation for an optimum repair method for bringing the mask after repair to a state equivalent to that of the normal region in consideration of the location and size of the defect, whether the defect form is a missing defect or an unnecessary pattern defect, and so on, and can control the ion beam column 11, the electron beam column 12, the deposition gas supply section 16, and the etching gas supply section 17 based on the calculation result.

Further, for the missing portion 153, the repair apparatus 10 can fill the missing portion 153 by irradiating a nitrogen ion beam while spraying a carbon gas such as pyrene, naphthalene, or phenanthrene, or a silane-based gas such as tetramethylcyclotetrasiloxane (TMCTS) from the deposition gas supply section 16. The mask 14 with a defect repaired in this manner enables the transfer of a pattern normally without transferring a defect even if the mask is exposed to light. On the other hand, in the case where there is an excess defect 154 on the mask 14, the repair apparatus 10 irradiates a nitrogen ion beam while spraying an etching gas onto the excess defect 154. Accordingly, the excess defect is removed by etching, and also an ion which decreases the light transmittance of a light transmissive region of the mask 14 is not implanted. In this manner, the repair apparatus 10 can repair and normalize the mask 14.

Further, the repair apparatus 10 can detect a timing when the light shielding band is removed to expose the base glass substrate by observing a change in the secondary electron image or the secondary ion image.

The repair apparatus 10 acquires a secondary electron image of a region after repair by irradiation with a nitrogen ion beam and also stores the image in association with an image before repair in the control unit 20 or the external information apparatus, and can confirm the repair performance after completion of the repair processing. The capability of full automation of such a series of operations is also the characteristic of the repair apparatus 10 of this illustrative embodiment. Further, by comparing a pattern obtained by actual light exposure using the repaired mask 14, the quality of the performance of the mask repair can be determined.

Further, in comparison with the mask repair using an electron beam which is the conventional technique, the choices of the mask material which can be repaired can be increased, so that the repair apparatus 10 according to this illustrative embodiment can also cope with the most advanced photomask material. Further, according to the repair apparatus 10 of this illustrative embodiment, by using a nitrogen ion beam, the processing speed can be greatly improved while maintaining an equivalent processing accuracy in comparison with a conventional photomask repair apparatus using a helium field ion source. Moreover, since the ion source itself is the gas field ion source 30 using the tip 1 of iridium according to this illustrative embodiment, stable beam formation can be performed over a long period of time, and at the same time, stable and highly accurate mask repair can also be performed over a long period of time.

By using iridium having high chemical resistance as the tip 1, and also by configuring the apex as described below, the atom at the apex of the tip 1 is maintained without being detached for a long period of time, and therefore, an ion can be emitted stably for a long period of time. Further, since the arrangement in each minute pyramid side surface at the apex portion of the tip 1 is dense, impurity particles around the tip 1 are hardly adhered to the tip 1, and thus, a focused ion beam with an extremely small variation in current or irradiation position can be formed, and as a result, a focused ion beam apparatus with high performance can be provided. Accordingly, the frequency of the regeneration process for restoring the damaged apex of the tip 1 so as to be constituted by a single atom can be remarkably reduced to reduce the frequency of maintenance of the apparatus, and thus, the burden on the users who operate the apparatus can be greatly reduced. In this illustrative embodiment, an example of photomask repair is described. However, the present invention is not limited thereto, and the repair apparatus 10 can also repair a defect in an EUV mask, a nano-imprint original plate, or the like.

(Third Illustrative Embodiment) Shape of Apex of Iridium Tip

The shape of the apex of the tip 1 of iridium according to an illustrative embodiment of the present invention will be described in detail.

An iridium crystal has a face-centered cubic structure, and iridium atoms are located at each of the eight corners and at the center of each of the six faces of a cube.

Figure 6A:
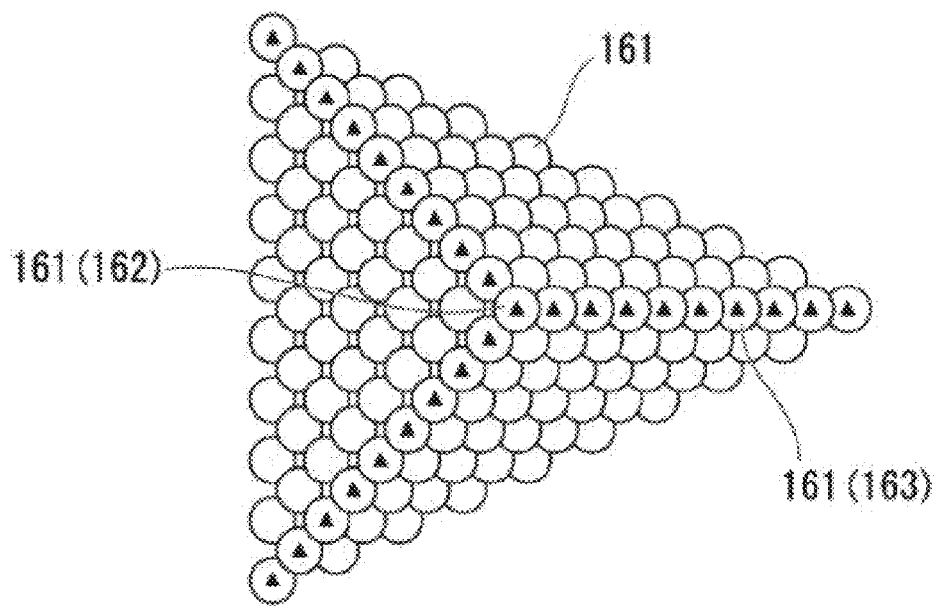
Figure 6B:
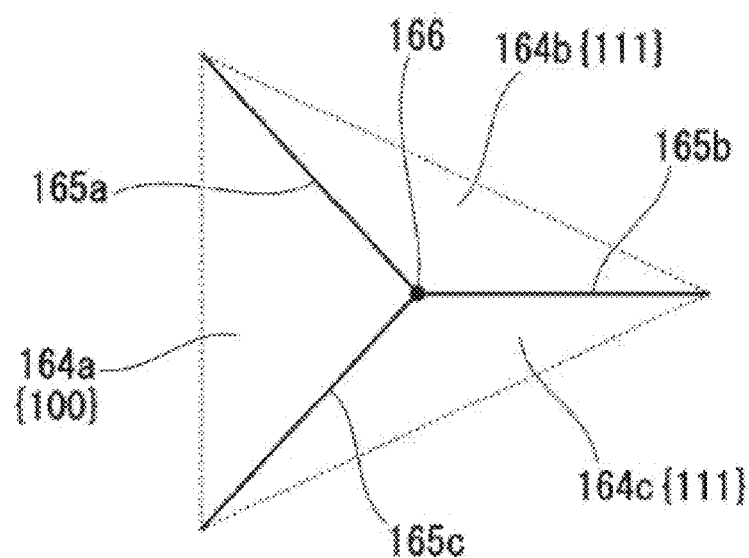

FIGS. 6A and 6B are views created based on the results of observation of the FIM image of the apex of the tip 1 of iridium according to this illustrative embodiment, and are model views showing a pyramid structure when viewing the apex portion of the tip 1 of iridium according to this illustrative embodiment from the <210> orientation. FIG. 6A shows an atomic arrangement with one circle made to correspond to one iridium atom 161. FIG. 6B is a view schematically showing crystal planes.

The pyramid structure at the apex portion of the tip 1 of iridium has a triangular pyramid shape having three side surfaces (pyramid surfaces) and an apex constituted by only a single iridium atom 161(162). The constituent atoms of this pyramid structure are all iridium atoms. As shown in FIG. 6A, the iridium atoms 161 present in the uppermost layer (outermost surface) of each crystal plane are indicated by white circles, and the indication of the internal iridium atoms 161 present below the uppermost layer is omitted. Further, to each of the iridium atoms 161(163) located on the ridge lines of the triangular pyramid shape, a black triangle mark is attached. As shown in FIG. 6B, the pyramid structure has ridge lines 165a, 165b, and 165c formed by each of the three pyramid surfaces 164a, 164b, and 164c, and an apex 166 constituted by a single iridium atom 161(162).

The pyramid surface 164a in FIG. 6B is a {100} crystal plane, and the pyramid surfaces 164b and 164c in FIG. 6B are {111} crystal plane.

Figure 7A:
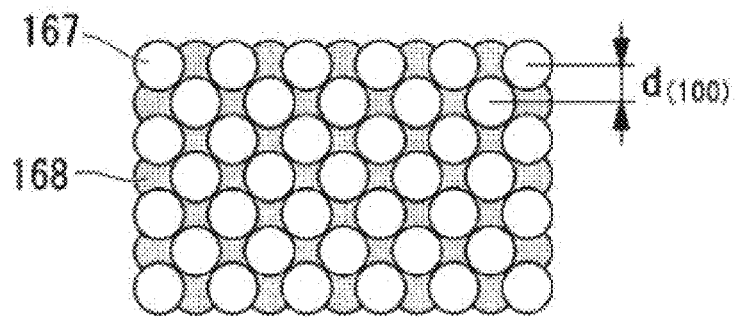
Figure 7B:
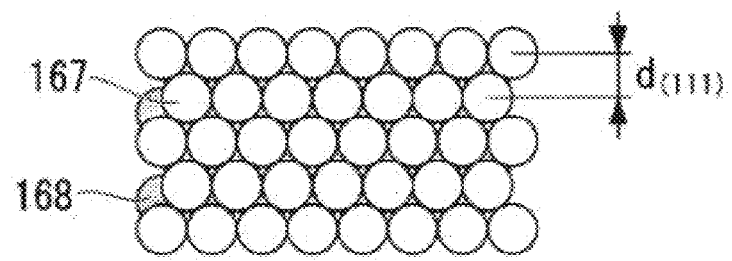

FIGS. 7A and 7B are views schematically showing the atomic arrangement when viewing each of the three pyramid surfaces 164a, 164b, and 164c of the pyramid structure according to this illustrative embodiment from the front (that is, from the normal direction). In FIGS. 7A and 7B, the iridium atoms 167 in the uppermost layer (surface layer) are indicated by white circles, and the iridium atoms 168 in the second layer immediately below the uppermost layer are indicated by gray circles, and the indication of the other iridium atoms is omitted.

A single iridium atom 162 constituting the apex of this pyramid structure is defined as the first layer, and in the atomic arrangement of the second layer immediately below the first layer, as shown in the following Table 1, three iridium atoms 161 are located at each vertex of an isosceles triangle close to an equilateral triangle (for example, an isosceles triangle in which when assuming that the length of the short side is taken as 1, the length of the isosceles side is approximately 1.22). In the atomic arrangement of the third layer immediately below the second layer, six iridium atoms 161 are located at each vertex and each side of a triangle.

Incidentally, the atomic arrangements of the second layer and the third layer are detected by forcibly detaching the iridium atom 161(162) at the apex by a strong electric field in the observation of the FIM image, and it has been found by the inventors of the present application that they match with the model views shown in FIGS. 6A and 6B.

Figure 8A:
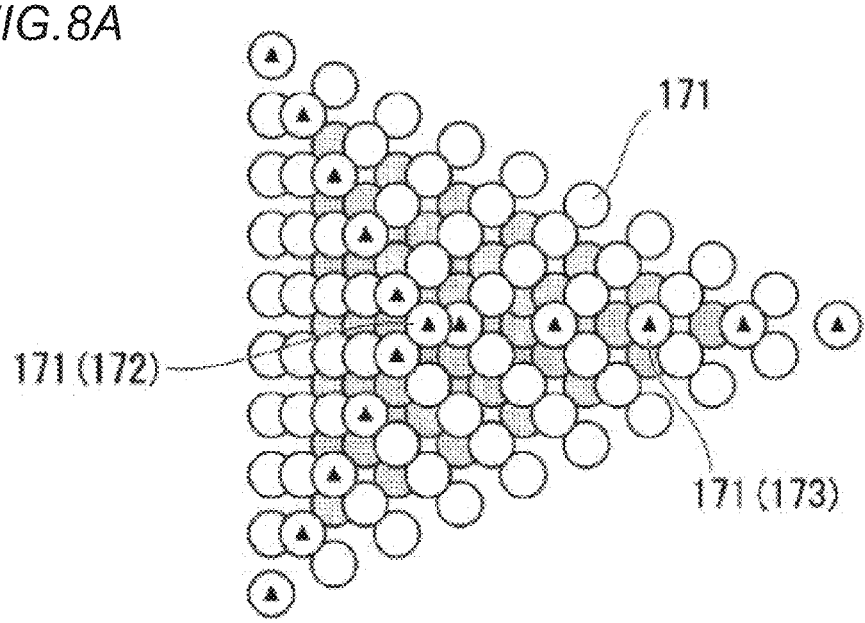
Figure 9A:
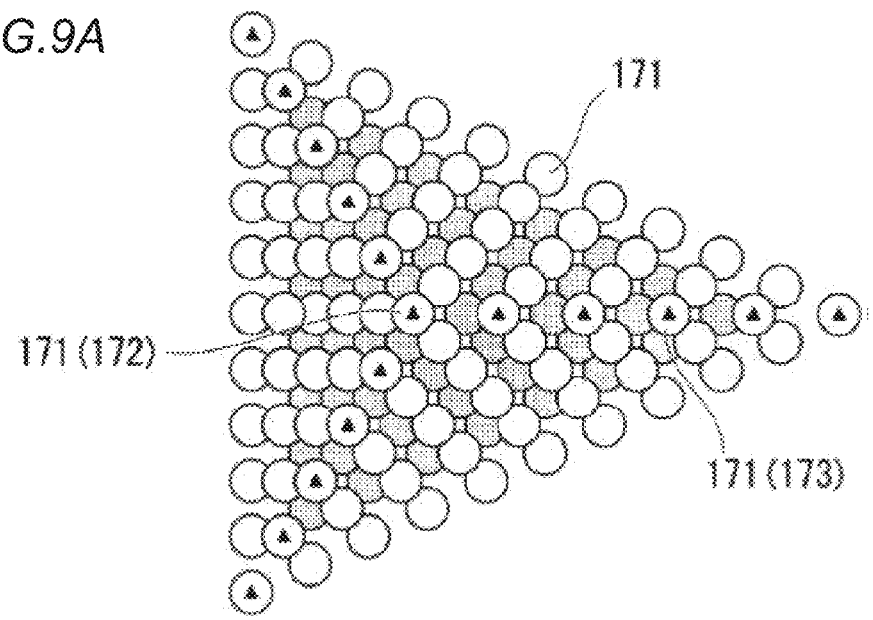

When the tip 1 of iridium in a state where the iridium atom 161(162) at the apex has been detached is used as a needle-shaped electrode of an electron source or an ion source, or as a probe of a scanning probe microscope, the amount of a beam current reaching a sample is decreased or the positional resolution of the scanning probe microscope is deteriorated, and therefore, such a tip is not preferred. In this case, by performing a regeneration process for the tip apex (described later), the atom at the apex is maintained as a single atom.

of the pyramid surface 174*a* is an odd number or an even number, and in the atomic arrangement shown in FIG. 8A, the number is an even number, and in the atomic arrangement shown in FIG. 9A, the number is an odd number. Depending on whether the number of the iridium atoms 171 constituting this base side is an odd number or an even number, the arrangement of the iridium atoms 171 constituting the second layer and the third layer immediately below the iridium atom 171(172) in the uppermost layer (surface layer) at the apex varies. The second layer in the atomic arrangement shown in FIG. 8A includes three iridium atoms 171, and the second layer in the atomic arrangement shown in FIG. 9A includes six iridium atoms 171. The iridium atom 171(172) in the uppermost layer (surface layer) at the apex in the atomic arrangement shown in FIG. 9A is located at the intersecting

TABLE 1

Number of atoms
Arrangement and number of atoms in each layer

| Layer | Present application (FIG. 6) | | Conventional example (FIG. 8) | | Conventional example (FIG. 9) | |
|---|---|---|---|---|---|---|
| First layer (apex) | O | 1 atom | O | 1 atom | O | 1 atom |
| Second layer | (3 circles) | 3 atoms | (3 circles) | 3 atoms | (6 circles) | 6 atoms |
| Third layer | (6 circles) | 6 atoms | (10 circles) | 10 atoms | (15 circles) | 15 atoms |

Figure 8B:
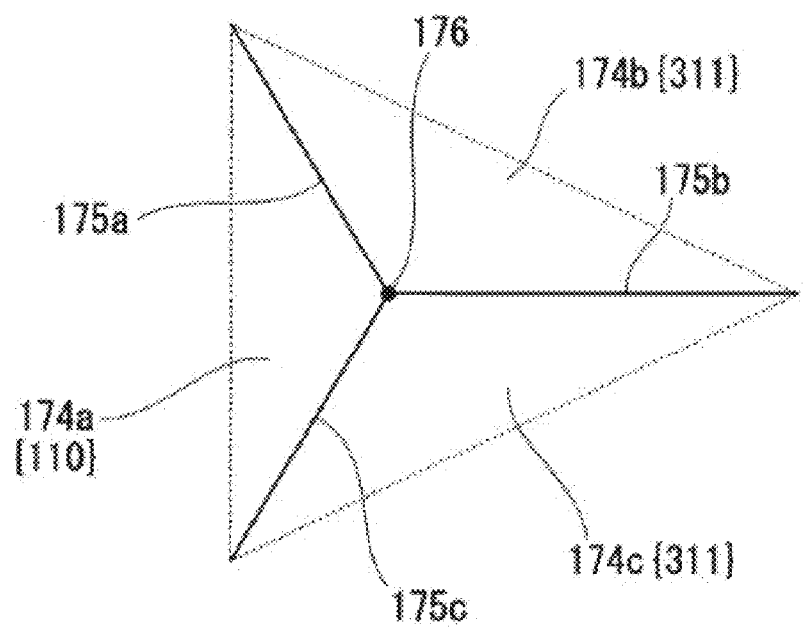
Figure 9B:
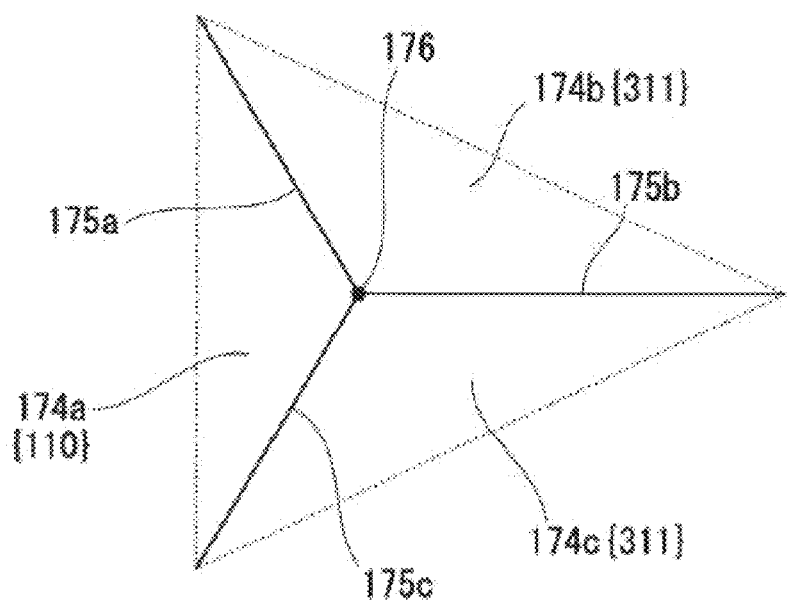

On the other hand, as Comparative Examples, the apex structures of iridium tips of conventional examples are shown in FIGS. 8A, 8B, 9A and 9B. FIGS. 8A and 8B are created with reference to the above-described document, Ivan Ermanoski et al., Surf. Sci. vol. 596, (2005), pp. 89-97, "Atomic structure of O/Ir(210) nanofacets", and FIGS. 9A and 9B are created with reference to the above-described document, Hong-Shi Kuo et al., Nanotechnology, vol. 20, (2009) No. 335701, "A Single-atom sharp iridium tip as an emitter of gas field ion sources". FIGS. 8A and 9A are model views showing the pyramid structures when viewing the iridium tips of the conventional examples from the <210> orientation. FIGS. 8B and 9B are views schematically showing the crystal planes.

As shown in FIGS. 8A and 9A, the iridium atoms 171 present in the uppermost layer (outermost surface) of each crystal plane are indicated by white circles, and the internal iridium atoms present below the uppermost layer are indicated by gray circles. At the apex of the triangular pyramid shape, one iridium atom 171(172) is located, and to each of the iridium atoms 171(173) located on the ridge lines of the triangular pyramid shape, a black triangle mark is attached. As shown in FIGS. 8B and 9B, the pyramid structure has ridge lines 175*a*, 175*b*, and 175*c* formed by each of the three pyramid surfaces 174*a*, 174*b*, and 174*c*, and an apex 176 constituted by a single iridium atom 171(172).

The pyramid surface 174*a* in FIGS. 8B and 9B is a {111} crystal plane, and the pyramid surfaces 174*b* and 174*c* in FIGS. 8B and 9B are {311} crystal plane.

A difference between the atomic arrangement shown in FIG. 8A and the atomic arrangement shown in FIG. 9A is that the number of the iridium atoms 171 constituting the base side point of the three ridge lines 175*a*, 175*b*, and 175*c*. On the other hand, the iridium atom 171(172) in the uppermost layer (surface layer) at the apex in the atomic arrangement shown in FIG. 8A is disposed at a slightly protruding position deviated from the intersecting point of the three ridge lines 175*a*, 175*b*, and 175*c*.

In the pyramid structures of the iridium tips of the conventional examples shown in FIGS. 8A and 9A, the interval between each of the iridium atoms 171(173) located on each of the ridge lines 175*a*, 175*b*, and 175*c* is wider than in the pyramid structure of the tip 1 of iridium of this illustrative embodiment shown in FIG. 6A. Therefore, the inclination of each of the ridge lines 175*a*, 175*b*, and 175*c*, in other words, the inclination of each of the pyramid surfaces 174*a*, 174*b*, and 174*c* is smaller than the inclination of each of the ridge lines 165*a*, 165*b*, and 165*c* and each of the pyramid surfaces 164*a*, 164*b*, and 164*c* of the pyramid structure of the tip 1 of iridium of this illustrative embodiment. That is, the apex portion of the tip 1 of iridium of this illustrative embodiment is sharper than the apex portions of the iridium tips of the conventional examples, and has a structure in which the electric field is concentrated on the apex of the tip 1 of iridium. Accordingly, the tip 1 of iridium of this illustrative embodiment can achieve ion emission at a lower extraction voltage than the iridium tips of the conventional examples, and therefore, the burden on a power source which applies an extraction voltage can be reduced, and also the occurrence of abnormal discharge between the apex of the tip 1 of iridium and an extraction electrode (for example, the extraction electrode 32 shown in FIG. 2, or the like) can be prevented.

Figure 10A:
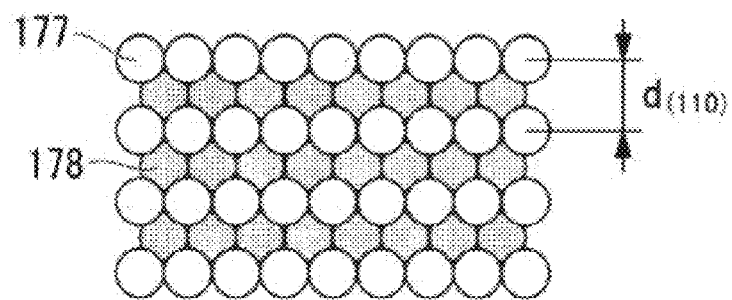
Figure 10B:
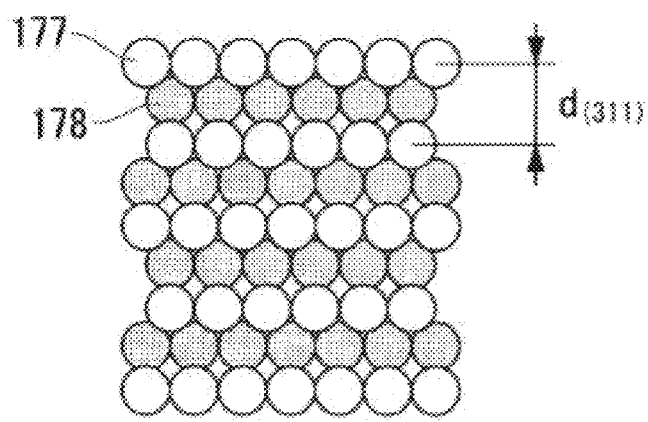

FIGS. 10A and 10B are views schematically showing the atomic arrangement when viewing each of the three pyramid surfaces 174*a*, 174*b*, and 174*c* of the pyramid structure of the iridium tip of the conventional example from the front (that is, from the normal direction). In FIGS. 10A and 10B, the iridium atoms 177 in the uppermost layer (surface layer) are indicated by white circles, and the iridium atoms 178 in the layer immediately below the uppermost layer are indicated by gray circles, and the indication of the other iridium atoms is omitted. Further, the vertical and horizontal atomic arrangement in each pyramid surface is not cared.

As shown in the above Table 1, the number of iridium atoms in the first layer, the second layer, and the third layer of the pyramid structure of the tip 1 of iridium of this illustrative embodiment is one, three, and six, respectively, however, the number of iridium atoms in the first layer, the second layer, and the third layer of the pyramid structure of the iridium tip of the conventional example shown in FIG. 8A is one, three, and ten, respectively, and the number of iridium atoms in the first layer, the second layer, and the third layer of the pyramid structure of the iridium tip of the conventional example shown in FIG. 9A is one, six, and fifteen, respectively. That is, with respect to the pyramid structure of the tip 1 of iridium of this illustrative embodiment and the pyramid structure of the iridium tip of the conventional example, it is apparent that the atomic arrangement up to the three layers is structurally different between the iridium tip of the conventional example and the tip 1 of iridium of this illustrative embodiment.

Further, the pyramid structure of the tip 1 of iridium of this illustrative embodiment and the pyramid structure of the iridium tip of the conventional example differ in the indices of crystal planes constituting the pyramid surfaces. That is, the {100} crystal plane and the {111} crystal plane constituting the pyramid surfaces of the pyramid structure of the tip 1 of iridium of this illustrative embodiment are low index planes having a higher atomic density than the {110} crystal plane and the {311} crystal plane constituting the pyramid surfaces of the pyramid structure of the iridium tip of the conventional example. For example, it is visually confirmed that in the atomic arrangement in the outermost surface layer of the pyramid structure of the tip 1 of iridium of this illustrative embodiment shown in FIGS. 7A and 7B, the iridium atoms are more densely arranged as compared with the atomic arrangement in the outermost surface layer of the pyramid structure of the iridium tip of the conventional example shown in FIGS. 10A and 10B.

For example, in a quantitative comparison, when the lattice constant is represented by d, the distance $d_{(100)}$ between adjacent atomic rows in the {100} crystal plane of the tip 1 of iridium of this illustrative embodiment shown in FIGS. 7A and 7B is 0.50d, and the distance $d_{(111)}$ between adjacent atomic rows in the {111} crystal plane thereof is 0.61d. On the other hand, with respect to each of the {311} crystal plane and the {110} crystal plane of the iridium tip of the conventional example shown in FIGS. 10A and 10B, the distance $d_{(311)}$ is 1.17d, and the distance $d_{(110)}$ is 1.00d. That is, as compared with the distance between the atomic rows in the pyramid surface of the pyramid structure of the tip 1 of iridium of this illustrative embodiment, the distance between the atomic rows in the pyramid surface of the pyramid structure of the iridium tip of the conventional example is wider.

Further, when the planar atomic density in the uppermost layer in each crystal plane is represented by n, in consideration that the lattice constant d of iridium is 0.3839 nm, the density n in the {100} crystal plane is $13.6 \times 10^{18}/m^2$ and the density n in the {111} crystal plane is $15.7 \times 10^{18}/m^2$, however, the density n in the {110} crystal plane is $9.6 \times 10^{18}/m^2$ and the density n in the {311} crystal plane is $8.2 \times 10^{18}/m^2$. That is, as compared with the atomic density in the outermost surface of the pyramid structure of the tip 1 of iridium of this illustrative embodiment, the atomic density in the outermost surface of the pyramid structure of the iridium tip of the conventional example is further decreased, and a space between each of the atoms present on the surface is wider in the conventional example than in this illustrative embodiment.

As described above, since the distance between the atomic rows in the outermost surface layer in the pyramid structure of the iridium tip of the conventional example is wide and the planar atomic density is low, it is presumed that, for example, the probability that a different type of atom or molecule drifting around the tip is fit in the space between each of the iridium atoms is high. The fitting of this different type of atom in the space may deteriorate the atomic arrangement of the iridium crystal at the apex of the iridium tip and disturb the electric field distribution at the apex of the iridium tip. As a result, the ion current emitted from the apex of the iridium tip may be unstable, and thus, the current of an ion beam irradiated on the surface of the sample may vary to cause disturbance of an observation image or disturbance of a processed surface. Further, such a different type of atom fit in the space between the iridium atoms cannot be easily removed, and therefore, when image disturbance or ion beam current variation occurs, a process requiring a complicated operation and a long time is needed, for example, a process in which the pyramid structure of the iridium tip is removed once by a high electric field, and the pyramid structure is produced again to stabilize ion emission is needed, and so on, and thus, a problem arises that a continuous observation or processing is difficult to perform.

On the other hand, in the one {110} crystal plane and the two {111} crystal planes constituting the pyramid surfaces of the pyramid structure of the tip 1 of iridium of this illustrative embodiment, the atomic distance is smaller than in the conventional example, and therefore, fitting of a different type of atom in a space between the iridium atoms is prevented, and the tip is merely brought to such a state that a different type of atom is adhered (physically adsorbed or the like) onto the crystal planes. In this case, a substance adhered onto the crystal planes can be easily detached by slight heating or by adjustment to a weaker electric field than a field strength necessary for ionization of nitrogen gas to be applied to the tip 1 of iridium, and therefore, the triangular pyramid structure of the crystal constituted by only iridium atoms can be always maintained. As a result, the ion emission current is stable for a long period of time, and a variation in current of an ion beam irradiated on a sample can be prevented, and thus, a less disturbed observation image or a less disturbed processed surface can be obtained.

Further, the pyramid structure of the tip 1 of iridium of this illustrative embodiment is configured such that the atomic distance is small, and therefore, it is approved that the tip 1 of iridium is strong against external disturbance such as temperature.

As described above, the tip 1 of iridium of this illustrative embodiment has a sharper pyramid structure than that of the iridium tip of the conventional example, and therefore, can achieve ion emission at a lower voltage, and also is strong against external disturbance, and has a structure such that impurities are hardly adhered thereto, and thus can achieve stable electron emission, ion emission, or the like for a long period of time.

Incidentally, the tip 1 of iridium of this illustrative embodiment described above has a structure in which the apex of the tip member of an iridium single crystal is sharpened at the atomic level, however, it is not limited thereto, and the surface of the sharpened tip 1 of iridium may be coated with an iridium thin film by plating or the like.

(Fourth Illustrative Embodiment) Iridium Tip Production Apparatus

Next, with reference to FIG. 11, a tip production apparatus 201 for further sharpening the tip 1 of iridium having undergone electrolytic polishing (described later), and processing into the tip 1 of iridium having an apex constituted by a single iridium atom will be described.

Figure 11:
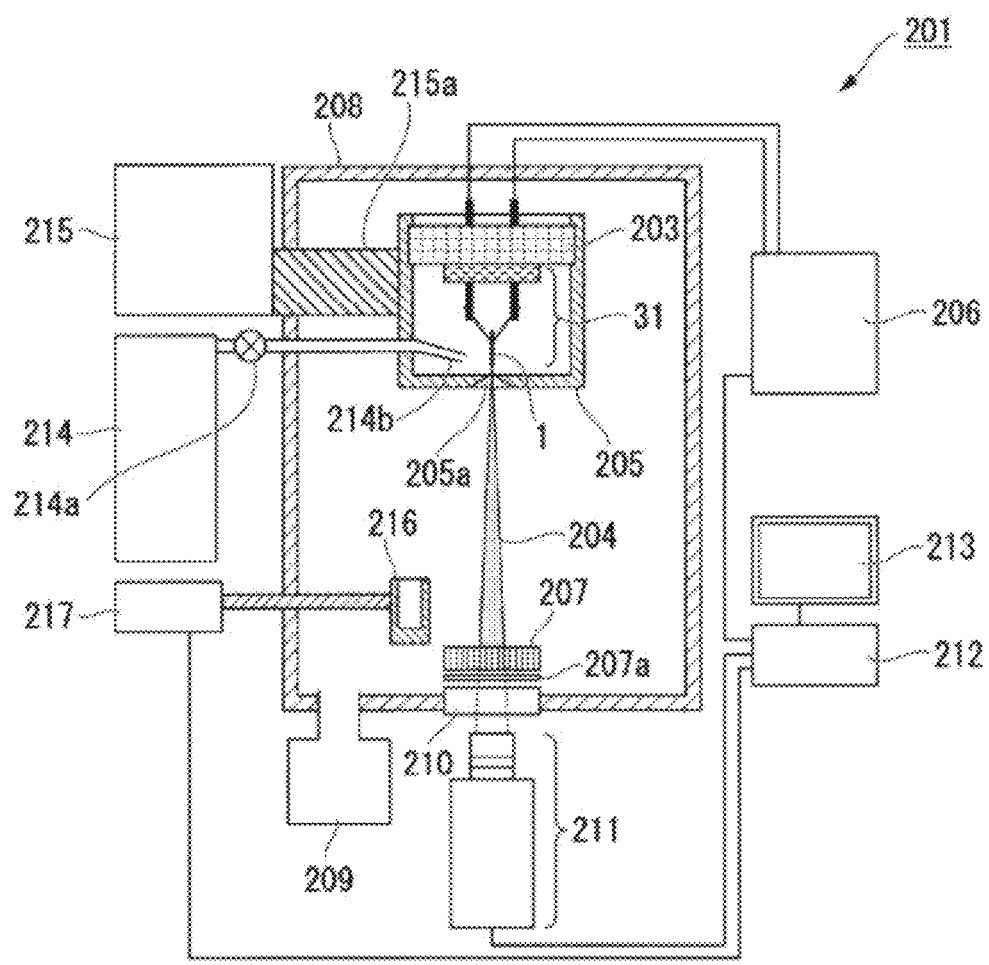
FIG. 11 is a schematic structural view of a tip production apparatus for producing a tip according to an illustrative embodiment of the invention.

FIG. 11 is a schematic structural view of the tip production apparatus 201. The tip production apparatus 201 includes a placement section 203 for placing the tip assembly 31, an extraction electrode 205 which generates a high electric field between the electrode and the tip 1 of iridium to emit ions 204 from the apex (tip apex) of the tip 1 of iridium, a power source 206 which applies an accelerating voltage of the ions 204 to the tip 1 of iridium and also heats the tip 1 of iridium, a detector (for example, Multi Channel Plate (MCP), or the like) 207 which detects the ions 204 emitted from the tip 1 of iridium, and a vacuum vessel 208 which accommodates these components therein.

Further, the tip production apparatus 201 includes an exhaust device 209 which maintains the inside of the vacuum vessel 208 in a vacuum state, a camera (for example, a CCD camera or the like) 211 which takes (or observes) an FIM image generated by the detector 207 through a view port 210, a computing device 212 which records the FIM image taken by the camera 211 and also controls the power source 206, and a monitor 213 which displays the FIM image taken by the camera 211, and the like.

Further, the tip production apparatus 201 includes a gas supply device 214 which supplies a gas to be ionized to the surroundings of the tip 1 of iridium, a cooling device 215 which cools the tip 1 of iridium and, if necessary, the gas supplied from the gas supply device 214, a movable Faraday cup 216 which detects the current of the ions 204 emitted from the tip 1 of iridium, a moving mechanism 217 which moves the Faraday cup 216, and the like.

The base pressure in the vacuum vessel 208 is set to approximately $2 \times 10^{-8}$ Pa. The surface of the tip apex is preferably maintained in a clean state, and the base pressure is preferably lower. To the vacuum vessel 208, the gas supply device 214 is attached.

The gas supply device 214 can supply a gas, which is a raw material of the ions 204, into the vacuum vessel 208. This gas is an easily available high purity gas (for example, having a purity of 99.999% or more, etc.). This gas may be further subjected to a gas purifier (not shown) so as to decrease the impurity concentration to about several ppb levels. It is necessary to decrease the impurity concentration for increasing the time for which the pyramid structure which is a nanostructure of the tip 1 of iridium can be maintained, and it is preferred to decrease the base pressure in the vacuum vessel 208 and also to decrease the impurity concentration in the gas.

In this illustrative embodiment, one or a plurality of gas vessels (not shown) filled with a gas such as hydrogen, oxygen, nitrogen, helium, neon, argon, krypton, or xenon is/are disposed in the gas supply device 214, and a desired gas can be supplied in an appropriate amount as needed. In the gas supply device 214, a valve 214a is adjusted so as to supply an appropriate amount of a given gas species to the apex of the tip 1 of iridium, and the gas is gradually supplied to the surroundings of the tip 1 of iridium from a nozzle 214b in the vicinity of the tip 1 of iridium.

The tip 1 of iridium is connected to the cooling device 215 such as a cryofreezer through a connection section 215a, and the cooling temperature is adjusted to about 60 K. According to this configuration, the FIM image generated by the detector 207 becomes brighter, and a sharp image can be taken by the camera 211. This cooling temperature may be changed according to the gas species to be supplied by the gas supply device 214.

The power source 206 is a high voltage current power source and is connected to the tip 1 of iridium through a feedthrough (not shown) in the vacuum vessel 208, and can apply a high voltage to the tip 1 of iridium through the filament 37. The power source 206 is configured to be connected so that, for example, the current power source has a potential output of a high voltage power source. The voltage to be output from the power source 206, a current to be applied to the filament 37 by the power source 206, and the like are controlled by the computing device 212 connected to the power source 206. The computing device 212 can automatically control the current and voltage output from the power source 206, and for example, can change the current at a constant rate. According to this configuration, the computing device 212 can repeat the remolding conditions with high reproducibility.

The extraction electrode 205 has, for example, ground potential, and a positive voltage is applied to the tip 1 of iridium. The ions 204 generated at the tip apex are extracted along the electric field generated by the tip 1 of iridium and the extraction electrode 205, and pass through an orifice 205a provided in the extraction electrode 205 and are output as an ion beam. The ion beam has an energy corresponding to the voltage applied to the tip 1 of iridium and is emitted from the extraction electrode 205 to the detector 207.

Incidentally, in this illustrative embodiment, the potential of the tip 1 of iridium can be made variable by causing the extraction electrode 205 to have an arbitrary potential. That is, it is possible to configure the apparatus to have a triple structure including the vacuum vessel 208, the extraction electrode 205, and the tip 1 of iridium in this order from the outside. In this case, the computing device 212 arbitrarily sets the potential of the tip 1 of iridium, and sets the potential of the extraction electrode 205 to a potential, which is negative with respect to the potential of the tip 1 of iridium, and at which a gas, which is a raw material of the ions 204, is ionized. According to this configuration, an accelerating energy of the ion beam can be appropriately set.

The detector 207 and a screen 207a are disposed along the extension of the line connecting the apex of the tip 1 of iridium to the orifice 205a of the extraction electrode 205. To the detector 207, a predetermined voltage (for example, +1.5 kV or the like) is applied, and generated electrons are amplified. To the screen 207a, a predetermined voltage (for example, +3.0 kV or the like) is applied, and the electrons amplified by the detector 207 collide with the screen 207a, and a phosphor of the screen 207a emits light. This emitted light is projected on the screen 207a and an image thereof is taken by the camera 211 through the view port 210, and is set so that it can be observed as an FIM pattern (FIM image). The camera 211 is connected to the computing device 212, and the images taken periodically are stored in the computing device 212.

When the number of bright points in the FIM image corresponding to the atomic arrangement at the apex of the tip 1 becomes one, it can be determined that the apex of the tip 1 of iridium is constituted by a single atom. At this time, the Faraday cup 216 is moved by the moving mechanism 217 so that the ion beam enters the Faraday cup 216, and the current of the beam entering the Faraday cup 216 is converted into a signal and introduced into the computing device 212. The beam current measurement enables the measurement of a current value at this time point and also enables the continuous measurement of a current variation over a long period of time.

In the vacuum vessel 208 of the tip production apparatus 201, a high vacuum state is always maintained, and therefore, an appropriate mechanism may be provided such that the tip 1 of iridium is temporarily kept in a preliminary exhaust chamber (not shown), and a process such as cleaning by heating at a high temperature for contaminations (impurities and the like) adhered to the tip 1 of iridium is performed, and thereafter, the tip 1 of iridium is introduced into the vacuum vessel 208.

Incidentally, the tip production apparatus 201 can also be used for sharpening a tungsten tip.

(Fifth Illustrative Embodiment) Iridium Tip Production Method

Figure 12:
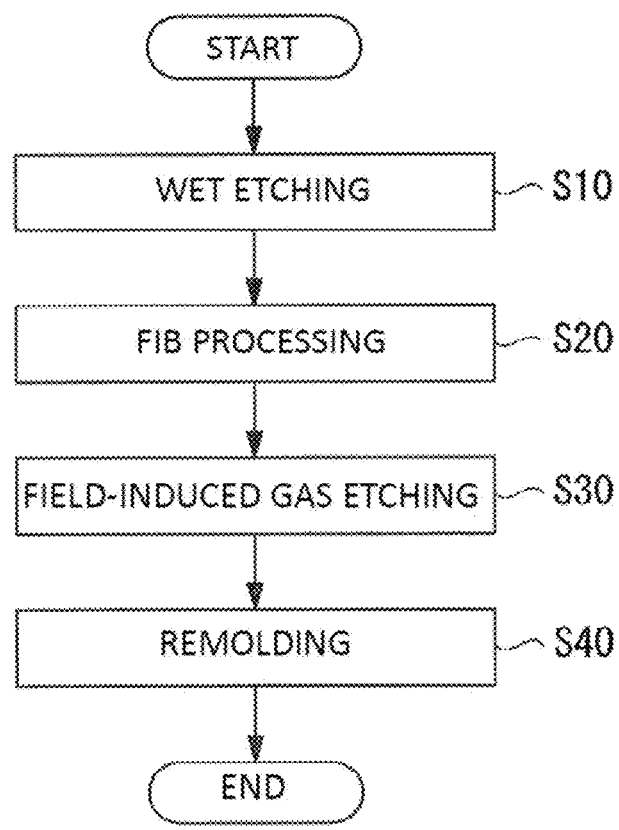
FIG. 12 is a flowchart showing a tip production method according to an illustrative embodiment of the invention.
Figure 13A:
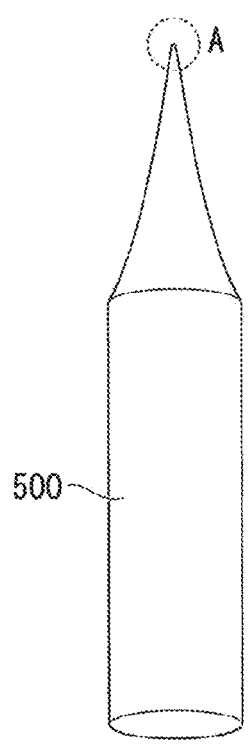
Figure 13B:
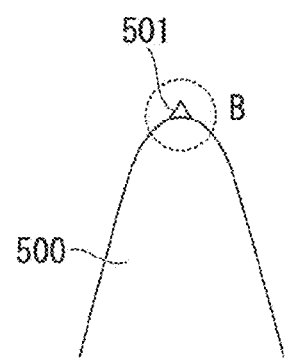
Figure 13C:
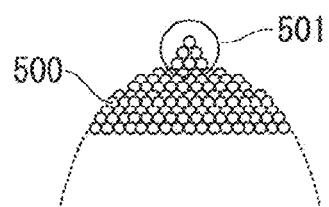
Figure 14:
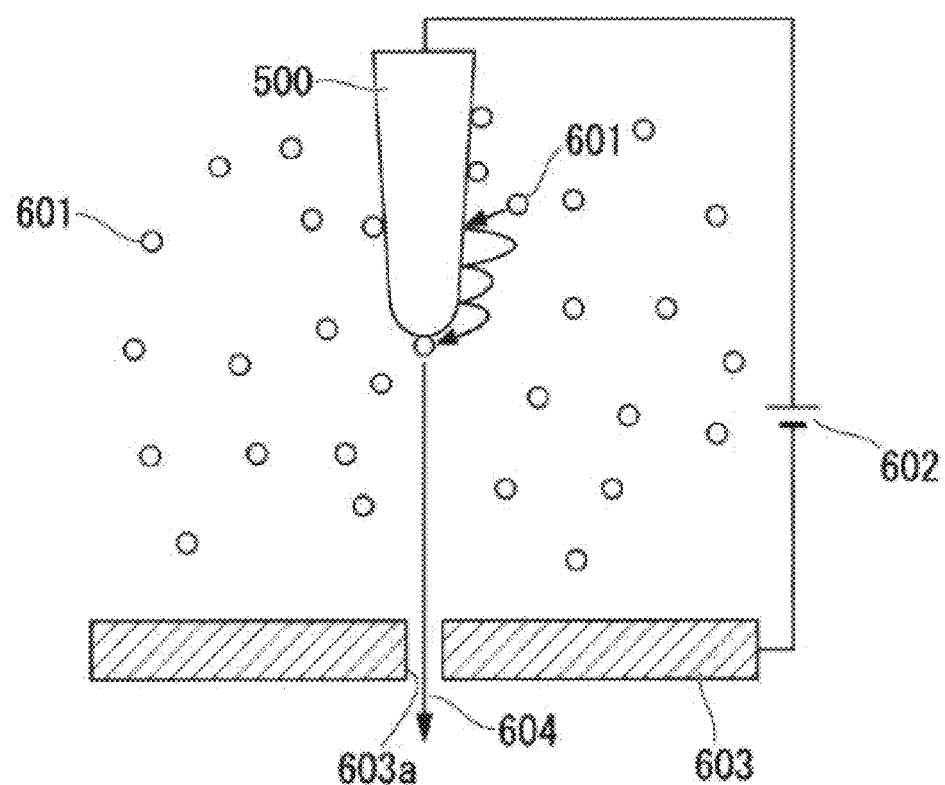
FIG. 14 is a schematic structural view for explaining ionization in a conventional gas field ion source.

As shown in FIG. 12, an iridium tip production method includes a wet etching step S10, an FIB processing step S20, a field-induced gas etching step S30, and a remolding step S40, which are performed sequentially. Hereinafter, the respective steps will be described.

(1) Wet Etching Step

First, in the wet etching step S10, as a raw material of the tip 1 of iridium to be sharpened, a tip member, which is a rod-shaped iridium single crystal having a given shape (for example, a diameter of 0.3 mm, a length of 8 mm, etc.), and in which the longitudinal direction is aligned with <210> orientation, is used. Then, for example, by wet etching, the rod-shaped tip member is sharpened until the diameter of the apex in a conical shape is decreased to a predetermined value (for example, from several hundreds of nanometers to several micrometers, or the like), whereby the tip 1 of iridium is formed.

Specifically, the tip member of iridium and a counter electrode of platinum are immersed in an electrolytic solution of, for example, potassium hydroxide (for example, 1 mol/L), and an AC voltage is applied between these two electrodes (that is, between the tip member and the counter electrode) to achieve electrolytic polishing. The AC voltage to be applied is set to, for example, approximately 30 V (rms) at a frequency of 60 Hz. By this wet etching step S10, the apex of the tip member is formed into a conical shape having an apex diameter of several hundreds of nanometers to several micrometers. After completing the wet etching, impurities such as the electrolytic solution are removed from the tip 1 of iridium by washing the tip 1 of iridium with water and acetone, or the like.

(2) FIB Processing Step

Subsequently, in the FIB processing step S20, in the case where the diameter of the apex of the tip 1 of iridium is further decreased to about several tens of nanometers to several hundreds of nanometers, after performing the wet etching step S10, the tip 1 of iridium is introduced into a known gallium focused ion beam (Ga-FIB) apparatus (not shown), and FIB processing is performed, whereby the diameter of the apex is decreased to about several tens of nanometers to several hundreds of nanometers.

(3) Field-Induced Gas Etching Step

Subsequently, in the field-induced gas etching step S30, the tip 1 of iridium is placed in a gas field ion source 30 or the tip production apparatus 201, and the surroundings of the tip 1 of iridium are brought to a vacuum state. A case where the tip production apparatus 201 shown in FIG. 11 is used will be described as an example. The pressure in the vacuum vessel 208 is adjusted to a base pressure (for example, $2\times10^{-8}$ Pa, or the like), and the cooling temperature of the tip 1 of iridium is adjusted to a predetermined temperature (for example, about 60 K). Then, helium is supplied from the gas supply device 214 into the vacuum vessel 208 until the pressure becomes, for example, $1\times10^{-4}$ Pa or the like. The computing device 212 controls the power source 206 so as to apply a voltage to the tip 1 of iridium. When the voltage applied to the tip 1 of iridium (tip voltage) reaches, for example, about 4 kV, the FIM pattern (FIM image) of helium is imaged by the camera 211.

In the tip 1 of iridium having undergone Step S20 or the tip 1 of iridium with a damaged apex structure, impurities are adsorbed on the surface of the apex of the tip 1 of iridium, and therefore, a pattern with no crystallinity is obtained. When the tip voltage is gradually increased and the field strength at the tip apex is increased higher than the evaporation field strength of iridium, the iridium atom begins to be field-evaporated. When the several atomic layers on the surface of the apex of the tip 1 of iridium are field-evaporated, clean crystalline iridium surface is exposed. The tip voltage at this time is increased to, for example, about 5 kV to 6 kV since the radius of curvature of the apex of the tip 1 is slightly increased. Then, when the tip voltage is decreased by, for example, about 1 kV, the tip voltage reaches an optimum voltage (best imaging voltage) at which an image is obtained by helium, and thus, an FIM pattern in which the atoms are regularly arranged appears. When such a clean surface is confirmed, the supply of helium into the vacuum vessel 208 from the gas supply device 214 is stopped. When the surface becomes a clean surface, a defect may sometimes be observed in the iridium crystal. In the case where there is a crystal defect in a clean surface, a desired pyramid structure cannot be produced in the subsequent remolding step S40. In such a case, by combining field-induced gas etching with field evaporation, the tip end surface layer of the tip 1 is removed to a region where there is no crystal defect. Based on if a clean surface is observed, it is determined whether the process proceeds to Step S40.

Subsequently, the extraction voltage is set to a value lower than the highest voltage applied in the field evaporation by about 0.5 kV (for example, about 4.5 kV to 5.5 kV), and as a gas for etching, nitrogen or oxygen is supplied to the surroundings of the tip 1 of iridium from the gas supply device 214 so that the pressure in the vacuum vessel is from about $1\times10^{-4}$ Pa to $1\times10^{-3}$ Pa.

In this case, the extraction voltage and the region to be subjected to field-induced gas etching of the tip 1 of iridium have a predetermined correspondence relation. That is, when the extraction voltage is low, an apex region of the tip 1 of iridium where the electric field is strong is etched with a field-induced gas, and when the extraction voltage is high, a peripheral region (for example, a base region or the like) of the tip 1 of iridium except for the apex region is etched with a field-induced gas. Therefore, in this step, the extraction voltage is set high to such an extent that helium is field-ionized, so that the apex region of the tip 1 of iridium is left, and the peripheral region thereof is etched. Accordingly, the number of iridium atoms which move in the remolding step S40 (described later) can be decreased, and the time required for performing the remolding step can be reduced. Further, the apex of the tip 1 of iridium is formed into a narrow and sharp shape, and therefore, the growth of the pyramid structure at an undesired position in the remolding step can be prevented. Here, when the field-induced gas etching proceeds, the apex is narrowed and sharpened, and therefore, the extraction voltage is decreased so that the atom at the apex is not field-evaporated.

When the apex is narrowed and sharpened to a desired size, while the extraction voltage is kept applied, the supply of the gas for etching by the gas supply device 214 is stopped, and the residual gas for field-induced gas etching is exhausted under vacuum. The best imaging voltage for helium at this time is approximately 3.6 kV. Thereafter, the extraction voltage is decreased so as to obtain a field strength at which nitrogen is field-ionized. By sufficiently performing vacuum exhaustion, the etching of the apex region of the tip 1 of iridium can be prevented, or by rapidly decreasing the extraction voltage, the field-induced gas etching of the apex region of the tip 1 of iridium can be further prevented.

Further, in the case where a crystal defect exists in the vicinity of the apex of the tip 1 of iridium, the extraction voltage is adjusted so that the apex region of the tip 1 of iridium is subjected to field-induced gas etching until the crystal defect is removed. Accordingly, even if a crystal defect exists in the vicinity of the apex of the tip 1 of iridium, the crystal defect is removed by etching.

(4) Remolding Step

Subsequently, in the remolding step S40, by using the tip production apparatus 201, a pyramid structure which is a nanostructure is formed at the apex of the tip 1 of iridium.

The extraction voltage is decreased to, for example, about ⅓ of the optimum imaging voltage for helium, that is, about 1.2 kV. This voltage substantially matches with the nitrogen imaging voltage. Then, nitrogen gas is introduced into the vacuum vessel 208, and the pressure is adjusted to, for example, $1 \times 10^{-3}$ Pa or the like. The extraction voltage is finely adjusted so that an FIM pattern of nitrogen can be observed. Then, the remolding step of this illustrative embodiment is started. In the remolding step S40 in this illustrative embodiment, remolding is performed in a nitrogen atmosphere unlike the conventional remolding which is performed under high vacuum without introducing a gas into the vacuum vessel 208. Further, in the conventional remolding, heating is performed while maintaining the current of the filament 37 constant, and the tip voltage is increased, and thereafter, the tip apex is sharpened while decreasing the current of the filament 37. In contrast, in this illustrative embodiment, sharpening is performed according to the following procedure.

First, the tip 1 of iridium is heated by applying a current of, for example, 3.5 A for 3 minutes to the filament 37 in a state where the extraction voltage is applied thereto. After completion of this heating, an FIM pattern of nitrogen is imaged and observed by the camera 211.

Here, in the case where the FIM pattern of nitrogen imaged and observed is almost not changed, heating is performed by increasing the current in increments of, for example, 0.1 A.

Figure 15:
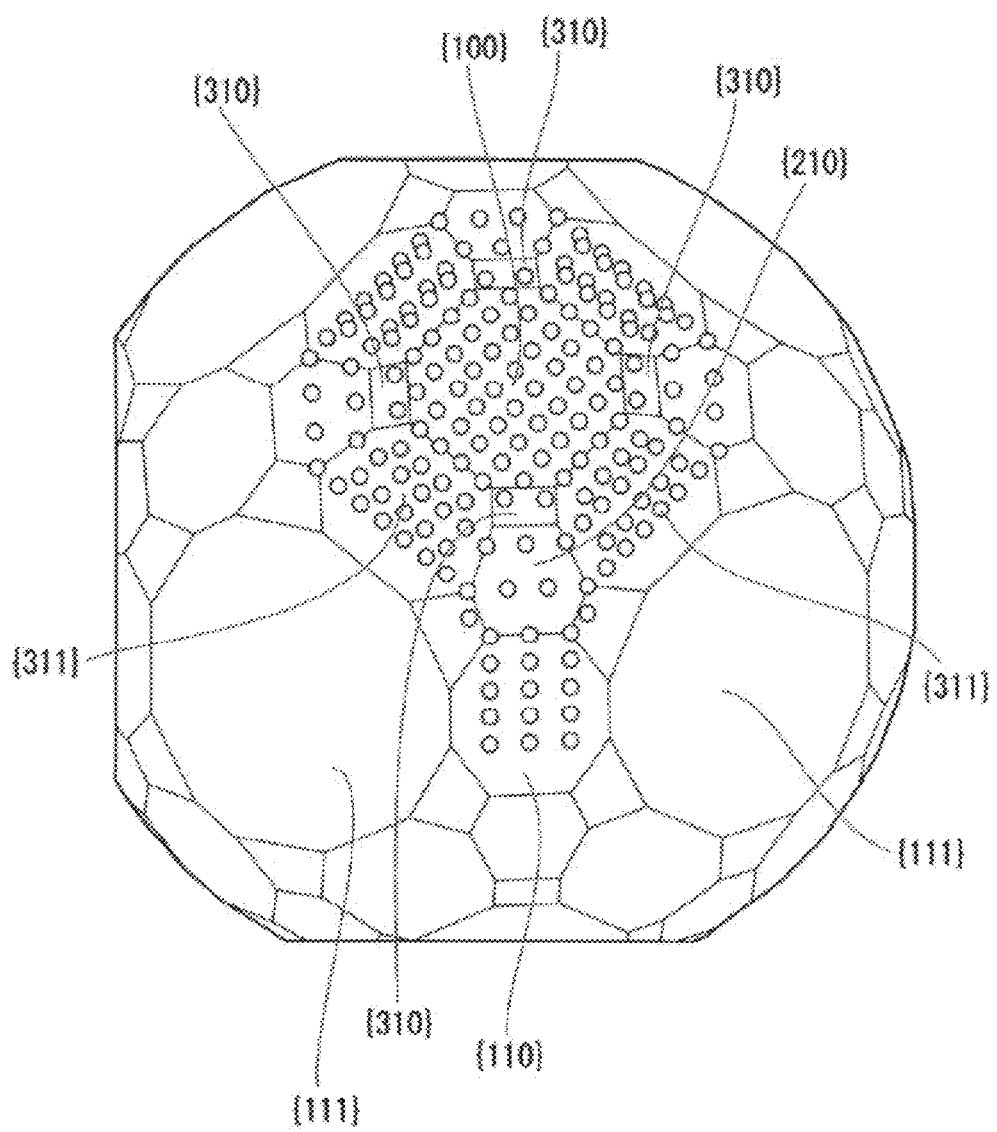
FIG. 15 is a view showing the arrangement of each crystal plane of iridium.

Then, when the current of the filament 37 is increased to, for example, approximately 3.9 A, a change is observed in the FIM pattern. That is, among the respective crystal planes as shown in FIG. 15, the {111} crystal plane is expanded, and the {110} crystal plane is shrunk. Further, the {100} crystal plane is expanded, and the {311} crystal plane is shrunk. When the facet planes are largely changed in this manner, the apex of the tip 1 of iridium is sharpened, and therefore, the tip voltage at which the FIM pattern of nitrogen is imaged and observed (that is, the tip voltage at which the FIM pattern of nitrogen is seen) by the camera 211 is decreased by, for example, several hundreds of volts. Incidentally, the tip voltage at which the FIM pattern of nitrogen is seen is approximately 0.9 kV or so.

Then, when the voltage at which the FIM pattern of nitrogen is seen is decreased, the current of the filament 37 is fixed at, for example, 3.9 A, and the tip voltage when heating is set to, for example, a value of 20% to 180% of the extraction voltage at which the FIM pattern of nitrogen is seen at this time point. In many cases, the tip voltage is changed to a value on the decreasing side. Incidentally, the tip voltage when heating is not limited to changing to a value on the decreasing side, which is equal to or lower than the tip voltage at which the FIM pattern of nitrogen is seen at this time point, and for example, according to the changing state of the crystal at the apex of the tip 1 of iridium obtained based on the FIM pattern of nitrogen or the like, the tip voltage may be changed to a value on the increasing side, which is equal to or higher than the extraction voltage at which the FIM pattern of nitrogen is seen at this time point.

Then, when heating is repeated by, for example, setting the tip voltage to 0.5 kV and the current of the filament 37 to 3.9 A, a bright point pattern including several bright points is imaged and observed by the camera 211.

Then, finally, only one bright point is left, and the apex of the tip 1 of iridium becomes a state where the apex of the tip 1 of iridium is constituted by only a single atom.

As an example of changing the extraction voltage to a value on the increasing side, which is higher than the value at which the FIM pattern of nitrogen is seen, there is a case where, when remolding is performed at an 80% of the extraction voltage, two {111} crystal plans do not grow with a ridge line formed by being interposed between the two {111} crystal planes remaining double, and in that case, when the extraction voltage is increased to 120% by gradually increasing the extraction voltage, the {111} crystal planes grow so that a single ridge line can be formed.

Incidentally, when the above-described remolding step S40 is performed without performing the field-induced gas etching S30, a problem arises that not only a desired pyramid structure is formed at a desired position, but also a plurality of pyramid structures are formed in some cases. When a plurality of pyramid structures are formed, the electric field at the apex of the tip is disturbed, and many unfavorable situations occur, for example, ions are emitted from a plurality of positions, a focused ion beam current to be required is decreased, and the like, and therefore, the above problems can be solved by performing Step S30 prior to Step 40.

Incidentally, in the remolding step S40, the tip 1 of iridium can also be produced by using oxygen gas in place of nitrogen gas. That is, oxygen gas is supplied in place of nitrogen gas into the vacuum vessel 208 from the gas supply device 214, the tip voltage is set so that the FIM pattern of nitrogen is seen, and the tip 1 of iridium is heated.

Then, the supply of oxygen gas is stopped, and nitrogen gas is supplied, and the tip voltage at which the FIM pattern of nitrogen is seen is confirmed. The supply of nitrogen gas is stopped at this voltage, and oxygen gas is supplied, and the tip 1 of iridium is heated. These processes are repeated. However, at this time, the heating temperature is gradually increased.

Then, when it is detected that the atom at the apex of the tip 1 of iridium begins to move based on, for example, the FIM pattern of nitrogen or the like, the extraction voltage is set to, for example, a value of 20% to 180% of the extraction voltage at which the FIM pattern of nitrogen is seen at this time point, and oxygen gas is supplied, and the tip 1 of iridium is heated. In many cases, the extraction voltage is changed to a value on the decreasing side. Incidentally, the tip voltage when heating is not limited to changing to a value on the decreasing side, which is equal to or lower than the tip voltage at which the FIM pattern of nitrogen is seen at this time point, and for example, according to the changing state of the crystal at the apex of the tip 1 of iridium obtained based on the FIM pattern of nitrogen or the like, the tip voltage may be changed to a value on the increasing side, which is equal to or higher than the tip voltage at which the FIM pattern of nitrogen is seen at this time point.

Then, finally, only one bright point is left, and the apex of the tip 1 of iridium becomes a state where the apex of the tip 1 of iridium is constituted by only a single atom.

Further, in place of nitrogen, helium or hydrogen may also be used. For example, in the case where nitrogen gas is used as an ion source gas, remolding is performed using nitrogen gas, and in the case where hydrogen gas is used as an ion source gas, remolding is performed using hydrogen gas, whereby an ion beam can be irradiated without changing the introduction gas.

According to the processing of the above-described Step S10 to Step S40, the tip 1 of iridium including a pyramid structure which has an apex with <210> orientation and constituted by only a single atom surrounded by one {100} crystal plane and two {111} crystal planes as shown in FIGS. 6A and 6B can be produced.

In the case where the tip assembly 31 is mounted not on the tip production apparatus 201 shown in FIG. 11, but on the gas field ion source 30 within an apparatus capable of forming a focused ion beam such as the repair apparatus 10, the above-described field-induced gas etching step S30 and the remolding step S40 can be performed within the gas field ion source 30, in which a beam is emitted. In this case, a step of relocating the tip assembly 31 from the outside of the gas field ion source 30 is not needed, and therefore, the adhesion of impurities during relocation of the tip assembly 31 can be prevented, and also, a step of relocating the tip 1 of iridium from the outside of the gas field ion source 30 is not needed, and therefore, the adhesion of impurities during relocation of the tip 1 of iridium can be prevented, and thus, the work efficiency can be improved. That is, in an apparatus capable of forming a focused ion beam such as the repair apparatus 10, in the case where the sharp end of the tip 1 of iridium is damaged, the regeneration operation can be performed at the place where the tip 1 is located. In particular, the field-induced gas etching step S30 and the remolding step S40 using nitrogen and the formation of a focused nitrogen ion beam can be performed using only nitrogen without changing the gas species to be introduced into the gas field ion source 30.

(Sixth Illustrative Embodiment) Repair Apparatus for Original Plate (Mold) for Nano-Imprint Lithography In nano-imprint lithography, an original plate having a microrelief pattern with high precision is prepared, the original plate is pressed against a transfer destination substrate coated with a softened resist while applying a pressure thereto, and the original plate is detached from the substrate after curing the resist, whereby the microrelief pattern of the original plate is transferred to the resist. Then, the overall film thickness is decreased with an oxygen plasma to expose the transfer destination substrate, and dry etching is performed, whereby the pattern is transferred to the substrate.

In conventional photolithography, a photomask in which a light shielding film is patterned on a transparent substrate is used, however, in nano-imprint lithography, light exposure is not employed, and therefore, this technique has an advantage that the apparatus can be simplified without needing to develop a light exposure apparatus having a short-wavelength light source which has an extremely high degree of difficulty. Further, the detached original plate can be used repeatedly.

Recently, there has been adopted photocurable nano-imprint lithography in which quartz is used as an original plate, and in place of a resist, a photocurable resin is applied on a transfer destination substrate, the original plate is pressed against the substrate, ultraviolet (UV) light is irradiated on the upper surface of the original plate to cure the photocurable resin to transfer the relief pattern of the original plate, and thereafter, the original plate is detached from the substrate. In the case of using a photocurable resin, the processing can be performed at room temperature, and therefore, this technique has an advantage that a decrease in positional accuracy due to thermal expansion of an original plate or a transfer destination substrate as in the case of using a thermally curable resin does not occur. There has been known a method for repairing a nano-imprint original plate using a focused gallium ion beam according to a known technique.

The repair apparatus 10 of this illustrative embodiment can repair a pattern error in the above-described original plate for nano-imprint lithography, and includes at least the gas field ion source 30 which generates nitrogen ions, and therefore can repair a missing pattern with a deposition film on the mask 14 by a gas supplied from the deposition gas supply section 16 and the etching gas supply section 17. Further, an unnecessary pattern can be removed. The tip 1 of iridium is mounted, and further, the tip is configured to have a pyramid structure which has an apex with <210> orientation and constituted by a single atom surrounded by one {100} crystal plane and two {111} crystal planes. According to this configuration, a focused nitrogen ion beam can be stably formed for a long period of time, and therefore, a nano-imprint original plate can be repaired with the focused nitrogen ion beam.

Another illustrative embodiment of the repair apparatus for an original plate for nano-imprint lithography will be described. This repair apparatus is configured to also mount an electron beam column 12 on the above-described repair apparatus 10 for an original plate for nano-imprint lithography. With an electron beam from this electron beam column 12, a normal pattern corresponding to a pattern error portion can be imaged from a plurality of directions, and from the information of the plurality of images, the three-dimensional shape data of the normal pattern can be reconstructed. In the case where a pattern error is a deletion, missing, or deformation error, the original plate is flattened once by removing the pattern error portion with a focused ion beam, and based on the above-described three-dimensional shape information, the normal pattern can be three-dimensionally printed by deposition with the above-described focused ion beam. In the case where there are a plurality of pieces of the same pattern, the same pattern can be printed one after another according to the same three-dimensional shape information.

Incidentally, in the case where a normal pattern is three-dimensionally printed, it is not limited to obtaining the three-dimensional shape information of the pattern shape using an electron beam or the like at the place where the pattern is located as described above, and the three-dimensional shape information of the normal pattern may be retrieved in the repair apparatus from an external storage unit.

Incidentally, this repair apparatus for an original plate for nano-imprint lithography may be used as a three-dimensional nano-printer for regeneration of a minute structure other than repair of an original plate for nano-imprint lithography.

(Seventh Illustrative Embodiment) Another Configuration of Mask Repair Apparatus In the above first illustrative embodiment, the repair apparatus 10 including the ion beam column 11 and the electron beam column 12 is described, however, in this illustrative embodiment, as another configuration of the repair apparatus 10, an example in which a scanning probe microscope is provided in the sample chamber 13 will be described.

A scanning probe microscope (SPM) is a microscope for magnifying and observing the surface aspect or state of a sample by scanning the surface of the sample such that the surface of the sample is traced with a sharpened probe, and one using a tunneling current flowing between the probe and a sample is called "scanning tunneling microscope (STM)", and one using an atomic force between the probe and a sample is called "atomic force microscope (AFM)".

In these scanning probe microscopes, it is preferred that the apex of the probe is constituted by a single atom from the viewpoint of observation resolution. Even if the probe immediately after production is terminated with a single atom, by repeatedly using the probe, the atom at the apex is detached to deteriorate the observation resolution, or the number of atoms at the apex is increased to more than one to frequently change the detecting atom, and therefore, a desired analysis result cannot be obtained. Accordingly, a scanning probe microscope including a probe capable of maintaining a state where the apex is constituted by a single atom for a long period of time so as to have high resolution and long lifetime has been demanded.

Therefore, in this illustrative embodiment, the tip 1 of iridium terminated with a single atom according to the above third illustrative embodiment is used as the probe of the scanning probe microscope. Iridium originally has high chemical resistance, and also due to the superiority that a state where the end is terminated with a single atom is maintained for a long period of time, which is the advantageous effect of the invention, a long lifetime and a high resolution observation result can be obtained.

In the basic configuration of the repair apparatus 10 of this illustrative embodiment, the ion beam column 11 and the electron beam column 12 are basically the same as those in the first illustrative embodiment, however, a feature that a scanning probe microscope is mounted on a vacuum vessel wall surface of the sample chamber 13 or the sample stage 15 is different from the configuration of the first illustrative embodiment.

According to the repair apparatus 10 of this illustrative embodiment, the surface shape of the pattern repaired by a nitrogen ion beam can be measured at the atomic order with this scanning probe microscope at the place where the pattern is located in the repair apparatus. If the apparatus is configured to mount the electron beam column 12 on the repair apparatus 10, a region to be measured by the scanning probe microscope can be detected based on a secondary electron image in advance, and therefore, the process transition to SPM measurement can be performed promptly. Further, a defect can be repaired by measuring a mask at the atomic order with the scanning probe microscope, determining a defect, and setting the irradiation amount of a nitrogen ion beam based on the data obtained by the determination. Further, by using the probe of the scanning probe microscope, a mask can be repaired by directly removing or moving atoms on the mask.

What is claimed is:

1. A repair apparatus comprising:
   a gas field ion source which includes an ion generation section including a sharpened tip;
   a cooling unit which is configured to cool the tip;
   an ion beam column which is configured to form a focused ion beam by focusing ions of a gas generated in the gas field ion source;
   a gas supply section which is configured to supply a gas to be ionized to the ion generation section, the gas supply section including a container which is configured to store and supply each of a plurality of gas species;
   a sample stage which is configured to move while a sample to be irradiated with the focused ion beam formed by the ion beam column is placed thereon;
   a sample chamber which is configured to accommodate at least the sample stage therein; and
   a control unit which is configured to repair a mask or a mold for nano-imprint lithography, which is the sample, with the focused ion beam formed by the ion beam column,
   wherein the gas field ion source is configured to generate nitrogen ions as the ions, and the tip is constituted by an iridium single crystal capable of generating the ions,
   wherein the gas supply section stores at least nitrogen and hydrogen as the plurality of gas species, and
   wherein the control unit is configured to use a hydrogen ion beam as the focused ion beam in a case where a mask for extreme ultraviolet light exposure is repaired as the mask, and to use a nitrogen ion beam as the focused ion beam in a case where a photomask is repaired as the mask.

2. The repair apparatus according to claim 1, wherein the tip includes a pyramid structure having an apex constituted by a single iridium atom.

3. The repair apparatus according to claim 1, wherein the tip is constituted by an iridium single crystal with <210> orientation, and an apex portion of the tip has an apex surrounded by one {100} crystal plane and two {111} crystal planes.

4. The repair apparatus according to claim 1, further comprising:
   a gas change section which is capable of changing the gas species to be supplied from the gas supply section.

5. The repair apparatus according to claim 1, further comprising:
   an ion change section which is configured to change ion species by changing a voltage required for ionizing a gas in the ion generation section.

* * * * *